(12) United States Patent
Stergiopoulos et al.

(10) Patent No.: US 6,894,494 B2
(45) Date of Patent: May 17, 2005

(54) METHOD AND DEVICE FOR CORRECTING ORGAN MOTION ARTIFACTS IN MRI SYSTEMS

(75) Inventors: Stergios Stergiopoulos, Toronto (CA); Miroslaw Wrobel, Wuerzburg (DE); Andreas Freibert, Einheim (DE); Waheed Younis, Toronto (CA); Amar Dhanantwari, Vaughan (CA)

(73) Assignee: Her Majesty the Queen in right of Canada, as represented by the Minister of National Defence of Her Majesty's Canadian Government, Ottawa (CA)

( * ) Notice: Subject to any disclaimer, the term of this patent is extended or adjusted under 35 U.S.C. 154(b) by 0 days.

(21) Appl. No.: 10/608,141

(22) Filed: Jun. 30, 2003

(65) Prior Publication Data
US 2004/0102695 A1 May 27, 2004

Related U.S. Application Data
(60) Provisional application No. 60/428,712, filed on Nov. 25, 2002.

(51) Int. Cl.[7] ................................................ G01V 3/00
(52) U.S. Cl. ........................................ 324/309; 324/318
(58) Field of Search ................................ 324/309, 307, 324/318, 322; 600/410, 422, 421; 128/653.2

(56) References Cited

U.S. PATENT DOCUMENTS

| | | | |
|---|---|---|---|
| 4,720,678 A | | 1/1988 | Glover et al. |
| 5,329,925 A | * | 7/1994 | NessAiver .................. 600/413 |
| 6,289,232 B1 | * | 9/2001 | Jakob et al. ................. 600/410 |
| 6,353,752 B1 | * | 3/2002 | Madore et al. ............. 600/410 |
| 6,717,406 B2 | * | 4/2004 | Sodickson .................. 324/307 |

OTHER PUBLICATIONS

Lenz et al; "Retrospective Cardiac Gating; A Review of Technical Aspects and Future Directions"; Magnetic Resonance Imaging; vol. 7, No. 5, Sep. 1989; pp. 445–455.

Bohning et al; "PC–Based System for Retrospective Cardiac and Respiratory Gating of NMR Data"; Magnetic Resonance in Medicine, Academic Press; vol. 16, No. 2, Nov. 1, 1990; pp. 303–316; ISSN: 0740–3194.

* cited by examiner

Primary Examiner—Brij B. Shrivastav
(74) Attorney, Agent, or Firm—Stites & Harbison PLLC; Ross F. Hunt, Jr.

(57) ABSTRACT

The present invention relates to a signal processing method and system for correcting organ motion artifacts for cardiac and brain imaging. A plurality of sets of MRI measurement data indicative of at least an image of an object is received. Each set corresponds to one row $k_x$ of a k-space matrix of at least a k-space matrix. For each set a k-space matrix of the at least a k-space matrix is determined for allocation thereto based on motion information of the object occurring during acquisition of the plurality of sets of the MRI measurement data. In a following step a location within the allocated k-space matrix corresponding to a row of the k-space matrix allocated thereto is determined for each set. At least a k-space matrix is then generated by re-arranging the plurality of sets. Each of the at least a k-space matrix comprises the sets of the plurality of sets of the MRI measurement data allocated thereto. Inverse Fourier transforming of the plurality of k-space matrices provides at least a reconstructed image. Through careful selection of the phases of the cardiac and respiratory cycles and corresponding ranges MRI data acquisition periods are of the order of seconds or a few minutes. Furthermore, integration of motion artifact free MRI images of different phases of organ motion using the coherent k-space synthesis according to the invention allows provision of an animation showing different phases of a cardiac or lung cycle. In an embodiment for correcting motion artifacts for brain imaging a motion vector describing translational and rotational motion of a patient's head is tracked during the MRI data acquisition process. The motion artifacts are then corrected based on coherent k-space synthesis using the motion vector data.

41 Claims, 20 Drawing Sheets

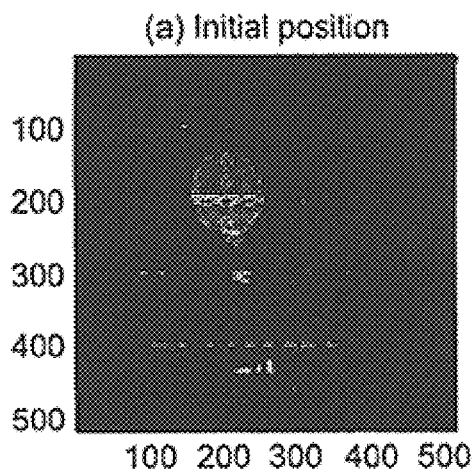
Fig. 20a (a) Initial position
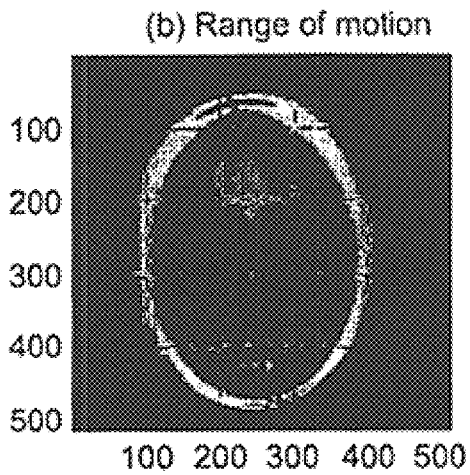
Fig. 20b (b) Range of motion
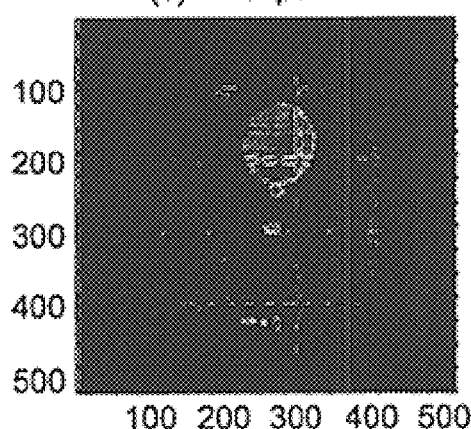
Fig. 20c (c) Final position
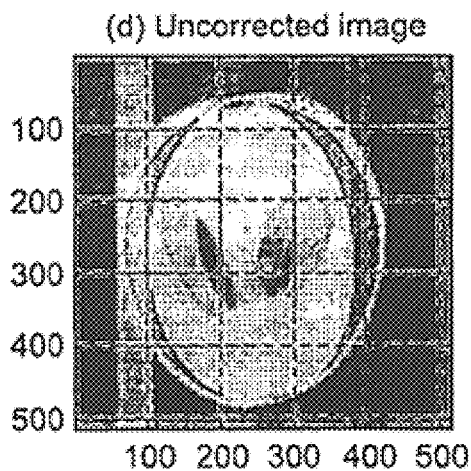
Fig. 20d (d) Uncorrected image
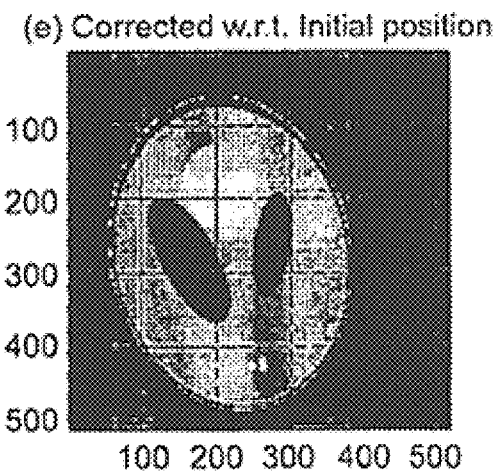
Fig. 20e (e) Corrected w.r.t. Initial position

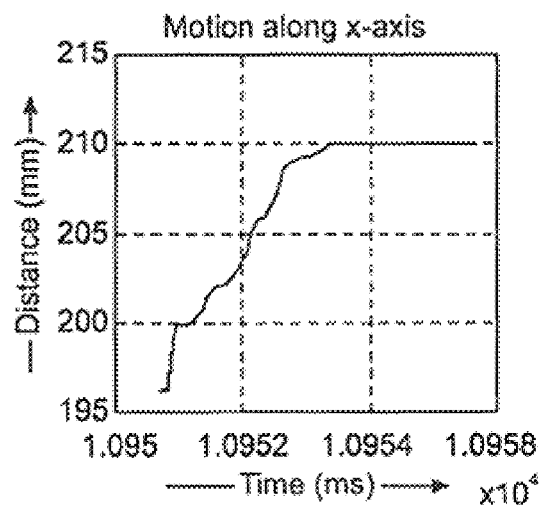
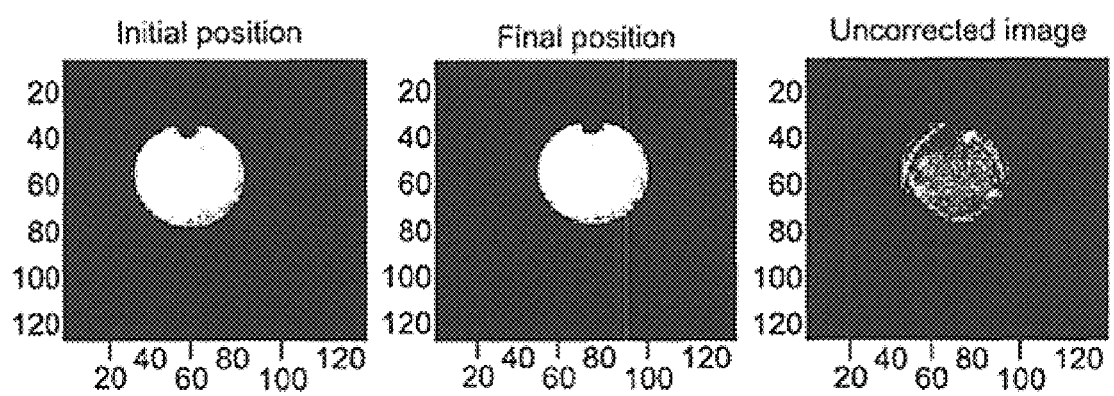
Fig. 21a
Fig. 21b
Fig. 21c
Fig. 21d
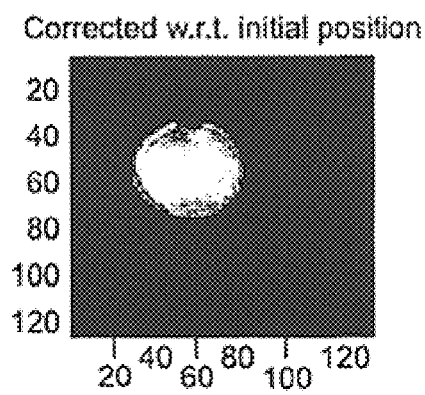
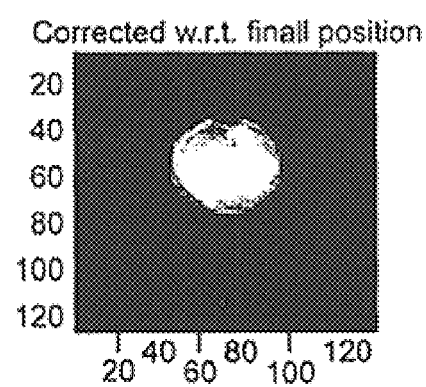
Fig. 21e
Fig. 21f

METHOD AND DEVICE FOR CORRECTING ORGAN MOTION ARTIFACTS IN MRI SYSTEMS

This application claims benefit from U.S. Provisional Application No. 60/428,712 filed Nov. 25, 2002.

FIELD OF THE INVENTION

This invention relates to magnetic resonance imaging and in particular to signal processing methods and systems for correcting organ motion artifacts for cardiac and brain imaging.

BACKGROUND OF THE INVENTION

Magnetic resonance imaging (MRI) is a medical imaging tool that provides cross-sectional images or "slices" of a human body. Major advantages of the MRI compared to other medical imaging techniques are high contrast sensitivity to soft tissue differences, high spatial resolution, ease of 2-dimensional (2D) and 3-dimensional (3D) imaging and patient safety due to use of non-ionizing radiation. Therefore, the MRI is presently the primary choice for cross-sectional imaging of the human body over many CT/X-ray and other tomography imaging techniques. Recently, the MRI has experienced substantial improvements in image quality due to introduction of novel MRI acquisition methods and equipment design. Today, the MRI is the preferred diagnostic tool for imaging studies such as neuro-radiological exams and applications continuously grow in areas thought not possible a few years ago such as 3D cardiac imaging.

During the MRI data acquisition process the patient is placed in a strong magnetic field of approximately 1 to 3 Tesla and a radio wave is radiated into the patient's body for a short duration. As a result the patient's body first absorbs the radio wave and then emits radio-frequency signals containing information about the spatial distribution of nuclear magnetization at a pre-selected cross section of the patient's body. This information is then used to produce the cross-sectional image employing Fourier transformation techniques.

One major disadvantage of the MRI is the relatively long data-acquisition time in order to produce high quality, diagnostically interpretable images. Unfortunately, the duration of the data acquisition is long enough—of the order of a few seconds—for organ motion such as cardiac motion, respiration, blood flow, peristalsis or restlessness to cause artifacts such as blurring and replication—commonly termed as ghosting—in the reconstructed image. As is evident, such artifacts substantially impede diagnosis or even lead to erroneous diagnosis. Numerous techniques for removing these artifacts have been disclosed in the following references which are hereby incorporated by reference:

Atalar, E., Onural, L., "A Respiratory Motion Artifact Reduction Method in Magnetic Resonance Imaging of the Chest", IEEE Transactions on Medical Imaging, Vol. 10, pp. 11–24, March 1991;

Axel, L., Summers, R. M., Kressel, H. Y., and Charles, C., "Respiratory effects in two-dimensional Fourier transform MR imaging", Radiology 160, pp. 795–801, 1986;

Bails, D. R., Glendale, D. J., Bydder, G. M., Collins, A. G., and Firmin, D. N., "Respiratory Ordered Phase Encoding (ROPE): A Method for Reducing Respiratory Motion Artifacts in MR Imaging", J. Comput. Assist. Tomogr., 9, 835, 1985;

Haacke, E. M., and Patrik, J. L., "Reducing Motion Artifacts in Two-dimensional Fourier Transform Imaging", Magnetic Resonance Imaging, 4, pp. 359–376, 1986;

Lauzon, M. L., and Rutt, B. K., "Generalized K-Space Analysis and Correction of Motion Effects in MR Imaging", Magnetic Resonance in Medicine, 30, pp. 438–446, 1993;

McConnell, M. V., Khasgiwala, V. C., Savord, B. J., Chen, M. H., Chuang, M. L., Edelman, R. R., and Manning, W. J., "Prospective Adaptive Navigator Correction for Breath-Hold MR Coronary Angiography", Magnetic Resonance in Medicine, 37, pp. 148–152, 1997; and, Wood, M. L., and Henkelman, R. M., "Suppression of respiratory motion artifacts in magnetic resonance imaging", Med. Phys. J., Vol. 13, 794, 1986.

Although the correction methods disclosed in the above cited references are effective under certain conditions, none of these methods completely eliminates the motion artifacts from the produced cross-sectional images. In particular, these methods do not substantially reduce the motion artifacts in case of more general motion effects such as combined cardiac and respiratory motion effects.

SUMMARY OF THE INVENTION

It is, therefore, an object of the invention to provide a method and system for processing MR signal data to correct organ motion artifacts.

It is further an object of the invention to substantially improve image quality by removing motion artifacts due to combined cardiac and respiratory motion effects.

It is yet further an object of the invention to provide a method and system for processing MR signal data for correcting organ motion artifacts for cardiac imaging.

In accordance with the present invention there is provided a method for motion correcting MRI measurement data comprising the steps of:

receiving a plurality of sets of the MRI measurement data indicative of at least an image of an object, each set corresponding to one row $k_x$ of a k-space matrix of at least a k-space matrix;

determining for each set of the plurality of sets of the MRI measurements a k-space matrix of the at least a k-space matrix for allocation thereto based on motion data indicative of the motion of the object occurring during acquisition of the plurality of sets of the MRI measurement data;

determining for each set of the plurality of sets of the MRI measurement data a location within the k-space matrix allocated thereto; and, generating at least a k-space matrix based on the sets of the plurality of sets of the MRI measurement data allocated thereto.

In accordance with the present invention there is further provided a method for motion correcting MRI measurement data comprising the steps of:

receiving a plurality of sets of the MRI measurement data indicative of an image of an object, each set corresponding to one row $k_x$ of a k-space matrix;

receiving cardiac and respiratory signal data, the cardiac and respiratory signal data being acquired simultaneously with the MRI measurement data from the object;

selecting phases of cardiac and respiratory cycles and determining respective ranges based on the cardiac and respiratory signal data;

selecting sets of the plurality of sets of the MRI measurement data being acquired during the selected phases of cardiac and respiratory cycles and falling within the determined ranges;

determining for each selected set of the plurality of sets of the MRI measurement data a location within a k-space matrix corresponding to a row of the k-space matrix allocated thereto;

generating the k-space matrix based on the allocated sets; and, reconstructing an image by inverse Fourier transforming the k-space matrix.

In accordance with an aspect of the present invention there is provided a system for motion correcting MRI measurement data comprising:

a storage medium having executable commands for execution on a processor stored therein, the processor when executing the commands performing the steps of:
  receiving a plurality of sets of the MRI measurement data indicative of at least an image of an object, each set corresponding to one row $k_x$ of a k-space matrix of at least a k-space matrix;
  receiving motion data indicative of a motion signal acquired from the object simultaneously with the plurality of sets of MRI measurements;
  determining for each set of the plurality of sets of the MRI measurements a k-space matrix of the at least a k-space matrix for allocation thereto based on the motion data;
  determining for each set of the plurality of sets of the MRI measurement data a location within the k-space matrix allocated thereto; and,
  generating at least a k-space matrix based on the sets of the plurality of sets of the MRI measurement data allocated thereto;

a first port for receiving the plurality of sets of the MRI measurement data;

a second port for receiving the motion data;

a processor in data communication with the first port, the second port and the storage medium, the processor for executing the executable commands for processing the plurality of sets of the MRI measurement data;

a MRI system for acquiring the plurality of sets of MRI measurements from the object and for providing measurement data indicative thereof, the MRI system for being in data communication with the first port; and, a motion sensing system for acquiring a motion signal from the object and for providing motion data indicative thereof, the motion sensing system for being in data communication with the second port.

Through careful selection of the phases of the cardiac and respiratory cycles and corresponding ranges MRI data acquisition periods are of the order of seconds or a few minutes. Furthermore, integration of motion artifact free MRI images of different phases of organ motion using the coherent k-space synthesis according to the invention allows provision of an animation showing different phases of a cardiac or lung cycle.

BRIEF DESCRIPTION OF THE FIGURES

Exemplary embodiments of the invention will now be described in conjunction with the following drawings, in which:

FIGS. 20a to 20e are diagrams illustrating the effects of the motion correction using the third embodiment shown in FIG. 19;

FIGS. 21a to 21f are diagrams illustrating the effects of the motion correction using the third embodiment shown in FIG. 19; and, FIG. 22 is a simplified block diagram illustrating a system implementation of the various embodiments of the method for correcting organ motion according to the invention.

DETAILED DESCRIPTION OF THE INVENTION

In MRI data acquisition a patient is placed in a first strong magnetic field called "slice selecting gradient". A radio frequency (RF) signal is then provided for absorption by the patient's body. The magnetic field together with frequency and bandwidth of the RF signal determine position and thickness of the slice of the patient's body being imaged. A second magnetic field called "phase encoded gradient" is provided for a short duration. Subsequently, a third magnetic field termed "frequency encoded gradient" is provided while a signal emitted from the patient's body is captured. The captured signal is digitized and recorded forming one row of a "k-space" matrix, denoted $k_x$ in FIG. 1. The three magnetic gradient fields are orthogonal to each other in order to identify the spatial location of protons emitting the signal. A following $k_x$ row of the k-space matrix is filled in a same manner but by providing a "phase encoded gradient" with a different intensity. This process is repeated with varying strength of the "phase encoded gradient" magnetic field until the complete k-space matrix is filled. Finally, using the 2-dimensional Inverse Fast Fourier Transform (2D-IFFT) of the k-space matrix, the MRI image of the selected slice is reconstructed.

Figure 2:
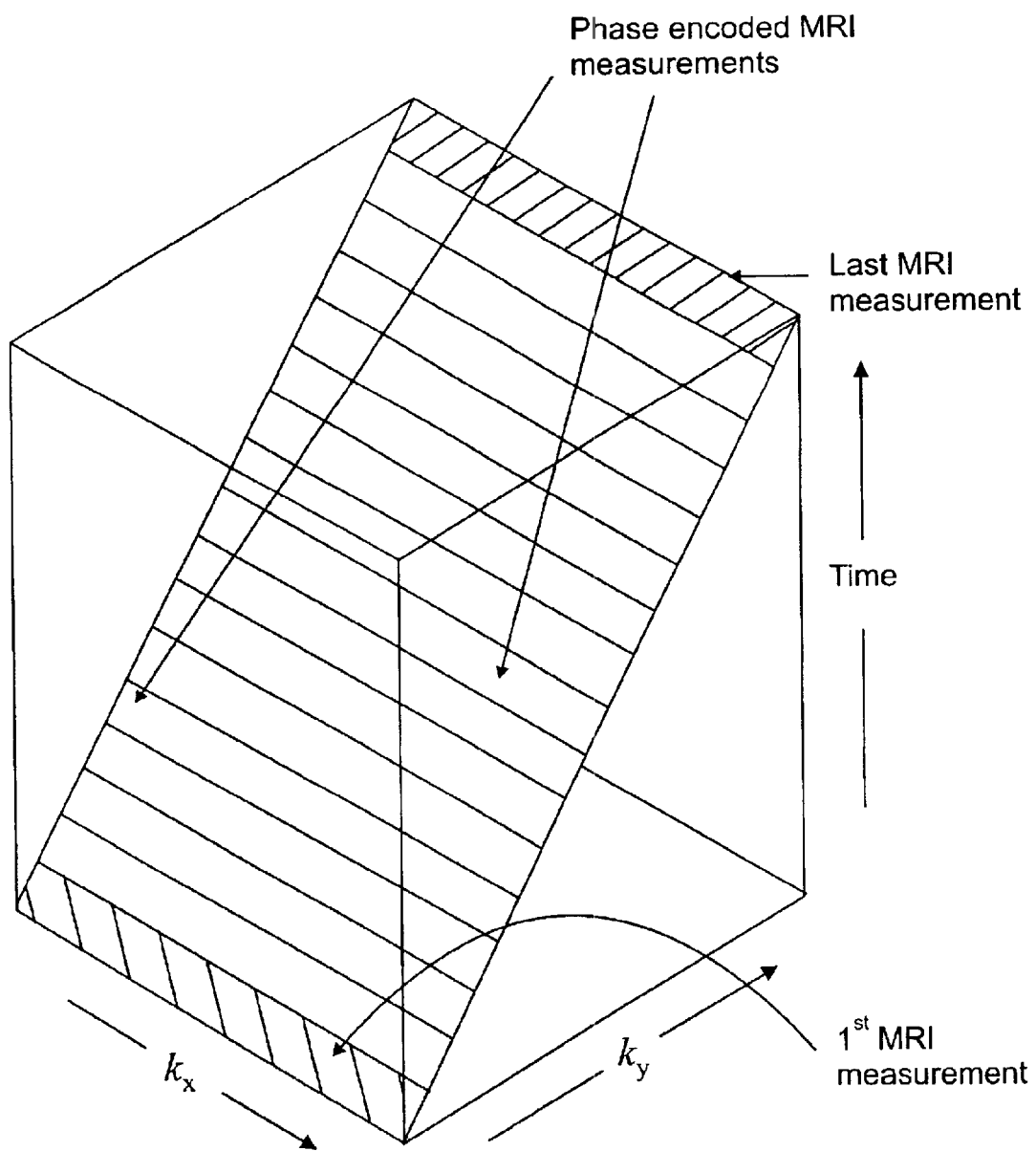

A phase encoded excitation results substantially instantaneously—in a few ms—in a single row of data of the k-space matrix and hence corresponds to a unique time instance. The next phase encoded excitation results in a different row of data corresponding to a different time instance, as shown in FIG. 2. Thus, in order to have a better understanding of the impact of organ motion on the MRI image reconstruction process, it is more reasonable to consider a 3-dimensional (3-D) (k, t) space, instead of a 2-dimensional (2-D) k-space in which each phase encoded excitation leads to one row of $k_x$ measurement along the $k_y$ direction at different time instances resulting in a plane inclined at an angle in (k, t) space. If all the measurements along the $k_y$ axis are taken in a very short period of time, the inclination of the plane is almost zero representing an image acquired instantaneously with no motion artifacts. However, the duration of the MRI data acquisition process results in an inclination large enough to cause motion artifacts in the reconstructed image. According to Fourier Projection Slice Theorem (FPST), if F(u, v, w) is a 3-D Fourier transform of the function $f(x, y, z)$, taking a 2-D slice of F(u, v, w) passing through the origin, the 2D-IFFT of this slice will produce the projection of $f(x, y, z)$ in the direction normal to the slice. Application of this theorem to the inclined plane of MRI data in (k, t) space shows that the 2D-IFFT will produce an image containing a temporal frequency spectrum of organ motion superimposed on a static image. If the motion is periodic or quasi-periodic resulting spectral islands are of discrete nature causing replication or ghosting, otherwise the motion will result in a continuous spectrum causing a blurring effect in the reconstructed image.

Figure 3:
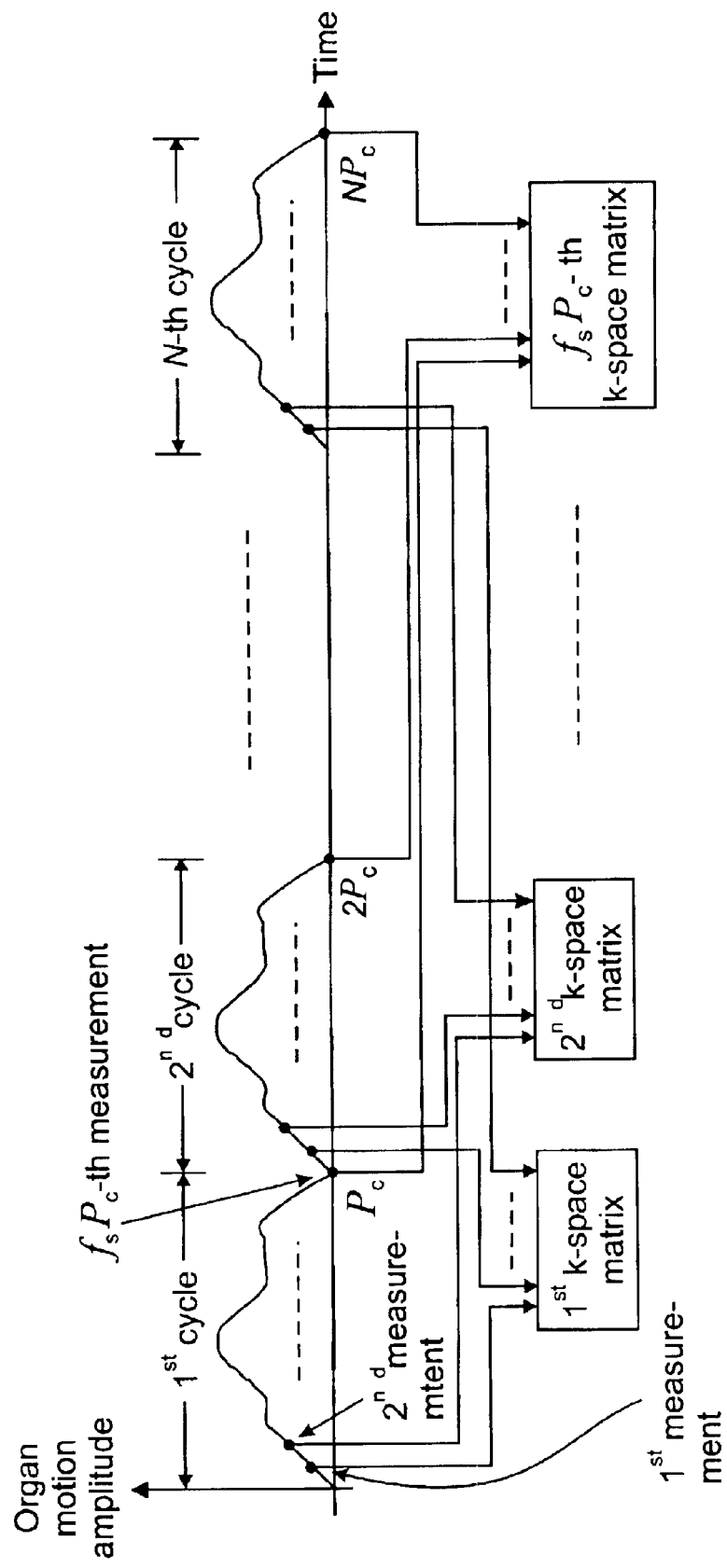
FIGS. 3 to 6 are simplified diagrams schematically illustrating the arrangement of MRI measurements according to the invention.

In the following various embodiments of a method for correcting organ motion in MRI image data according to the invention will be disclosed. The method for correcting organ motion according to the invention comprises two basic steps. Firstly, MRI measurement data corresponding to a specific phase of organ motion are collected and placed at a proper location within a k-space matrix. This step is named "coherent k-space synthesis". Secondly, 2D-IFFT of the k-space matrix provides a reconstructed MRI image. Furthermore, application of the coherent k-space synthesis on a plurality of acquired MRI data sets allows creation of MRI images corresponding to different phases of the moving organ, as shown in FIG. 3. For example, this allows the creation of an animation showing a complete cycle of the moving organ.

For simplicity it is first assumed that the object being imaged is going through a periodic motion with a period of $P_c$ seconds. As it will be discussed later, the coherent k-space synthesis according to the invention is expandable to variations in the period $P_c$ of the organ motion. If the sampling frequency of the MRI data acquisition process is $f_s$ in Hz, i.e. the sampling for acquisition of phase encoded measurements of $k_x$ rows in the k-space matrix in one second, then there will be $P_c f_s$ sets of measurements acquired in one cycle of the organ motion. In the coherent k-space synthesis process these sets of measurements are re-arranged into k-space matrix groups corresponding to different phases of the organ motion. This re-arrangement results in $P_c f_s$ different k-space matrices, representing $P_c f_s$ different images corresponding to different phases of organ motion. Obviously, the $(P_c f_s + 1)^{th}$ measurement then belongs to the first k-space matrix group again.

In order to re-arrange the MRI measurements it is determined for each MRI measurement to which particular k-space matrix corresponding to a specific phase of the organ motion the MRI measurement belongs. The i-th $k_x$ row of the MRI measurements, i.e. $k_x[n]$ (n=1,2, . . . ), that corresponds to the i-th k-space matrix (i=1,2, . . . , $P_c f_s$) is defined by $$i = \mathrm{mod}(n-1, P_c f_s) + 1, \quad (1)$$

as shown in FIG. 3.

Figure 1:
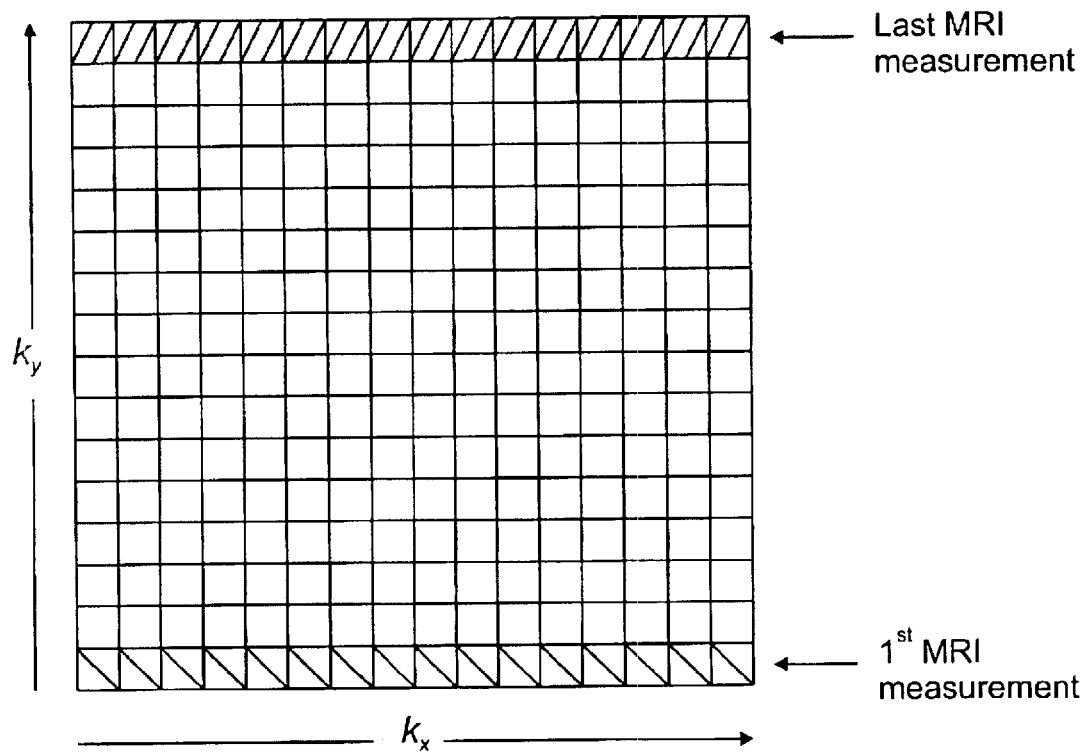
FIGS. 1 and 2 are simplified diagrams schematically illustrating the arrangement of MRI measurements in a k-space matrix.

Each measurement $k_x[n]$ represents a complete row of the k-space matrix as shown in FIG. 1. Based on equation (1) it is determined to which k-space matrix a particular MRI measurement belongs. The next important step is to determine the location of the MRI measurement within the k-space matrix.

Figure 4:
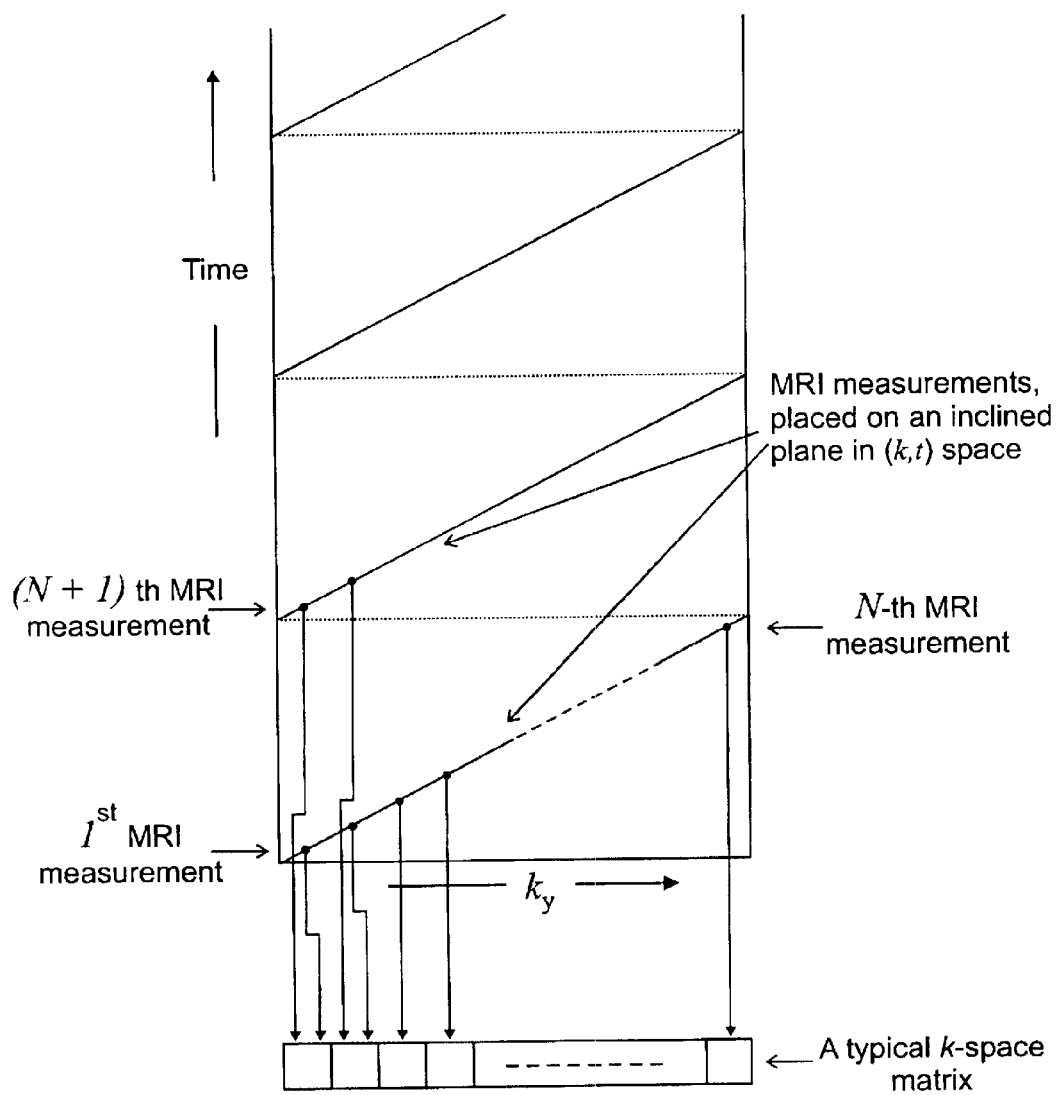

For a 256×256 reconstructed MRI image, the total number of N rows $k_x[n]$ (n=1,2, . . . ) in each k-space matrix is 256, and each row $k_x$ has 256 elements. Therefore, in order to provide data for one complete MRI image N=256 rows $k_x[n]$ (n=1,2, . . . ) are acquired. The coherent k-space synthesis according to the invention is based on the assumption that there is a continuous MRI acquisition of rows $k_x[n]$ well beyond N. Based on this assumption the location r of a given MRI measurement within the determined k-space matrix is given by $$r = \mathrm{mod}(n-1, N) + 1, \quad (2)$$

as shown in FIG. 4. In short, the re-arrangement process of the coherent k-space synthesis according to the invention comprises the two steps of:

1) determining the $i^{th}$ k-space matrix for a given MRI measurement $k_x$ using equation (1); and,
2) determining the $r^{th}$ location of the given MRI measurement within the $i^{th}$ k-space matrix.

Since there are $P_c f_s$ matrices with N measurements in each k-space matrix the total number of measurements for one cycle of the organ motion is $NP_c f_s$, which is acquired in $NP_c$ seconds. The above re-arrangement process is based on the assumption that there are no different measurements filling a same row in a same k-space matrix, i.e. there is no "collision" between various measurements. However, collisions have been observed during MRI data acquisition processes resulting in partial filling of the k-space matrices. The partial filling of the k-space matrices is due to the chosen sampling of measurements in the MRI data acquisition process and is independent of the duration of the MRI data acquisition process. The partial filling of a k-space matrix results in spatial aliasing in the image reconstructed therefrom. In the coherent k-space synthesis according to the invention this problem is overcome by choosing the parameters $P_c$ and $f_s$ such that:

$$\gcd(P_c f_s, N) = 1, \quad (3)$$

i.e. the greatest common divisor of $P_c f_s$ and N is one, or, in other words, $P_c f_s$ and N are relatively prime. Since N is likely a radix 2 number—e.g. 128, 256, 512, . . . —the greatest prime factor of N is 2. Thus, if $P_c f_s$ is chosen to be an odd integer, equation (3) is satisfied.

Figure 5:
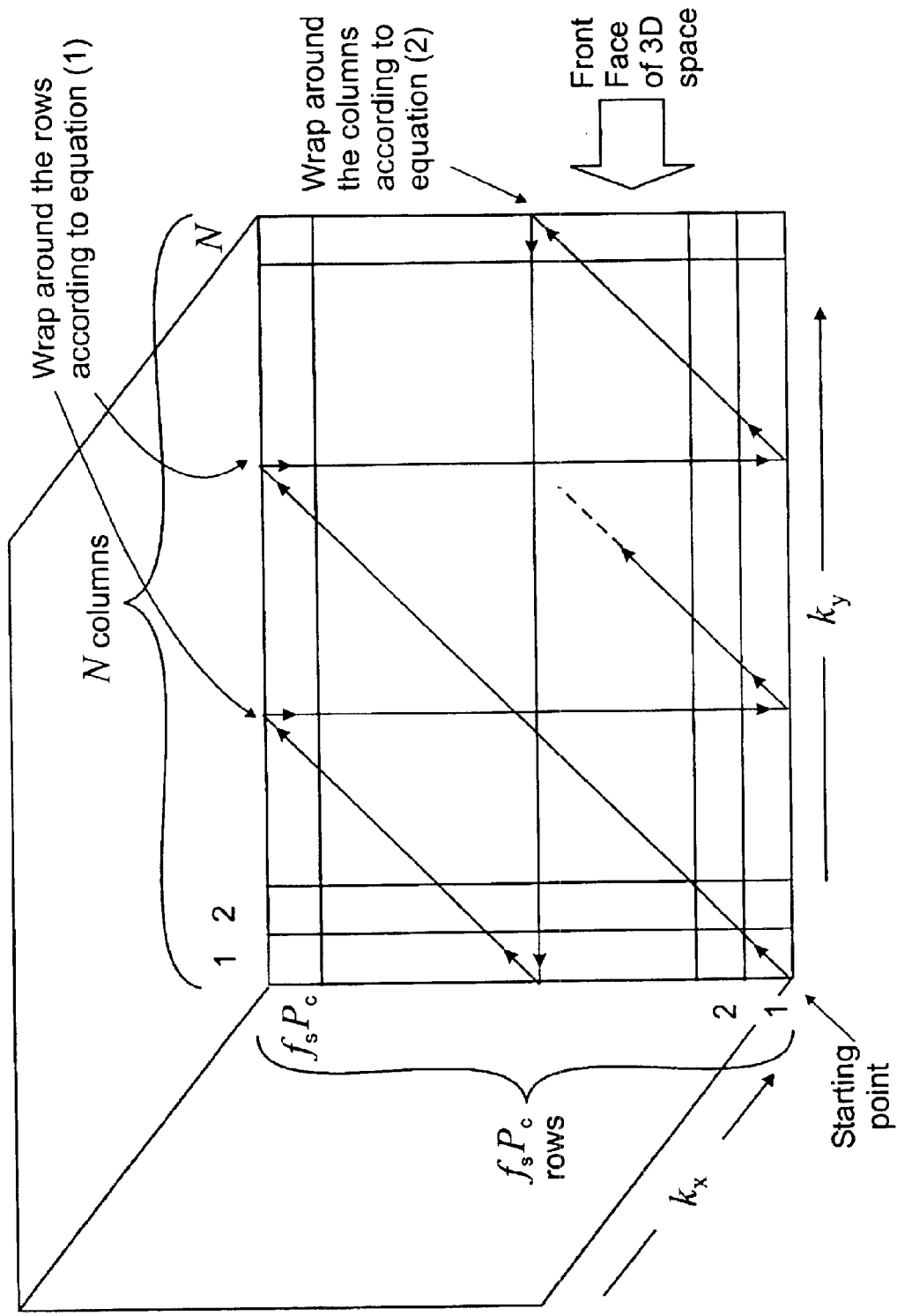

In the following the procedure of re-arranging the MRI measurements according to the invention will be explained with reference to FIG. 5. There are $P_c f_s$ k-space matrices, each having N rows. Staking of the $P_c f_s$ k-space matrices forms a 3D space, as shown in FIG. 5. Since each measurement $k_x$ fills the entire row of the k-space matrix in $k_x$ direction instantaneously, the process of re-arranging the MRI measurements is considered as filling a 2D array of $P_c f_s$ rows and N columns. The first measurement $k_x[1]$ is allocated into the $1^{st}$ k-space matrix as the first row forming the first element (1, 1) of the 2D array. The second measurement $k_x[2]$ is allocated into the $2^{nd}$ k-space matrix as the second row forming element (2, 2) of the 2D array. The following measurements are arranged analogously forming the elements (3, 3), (4, 4), etc. After filling the last row—$P_c f_s$—the process of filling the 2D array is wrapped around going back to the first row—equation (1). Then the filling continues by increasing each of the row number and the column number of the elements by 1 for subsequent measurements until the last row or the last column of the 2D array is filled. Similarly, after the last column is filled the filling process is wrapped around going back to the first column—equation (2). This re-arrangement process is continued until the last element (N, $P_c f_s$) of the 2D array is filled. If continued beyond this point, the process repeats itself starting at (1, 1) and filling the 2D array in the same sequence. Hence, continuing the process beyond the last element only adds redundant measurements. Since this technique is based on wrapping around the columns and the rows of the 2D array it is called in the following the double wrap technique.

Figure 6A:
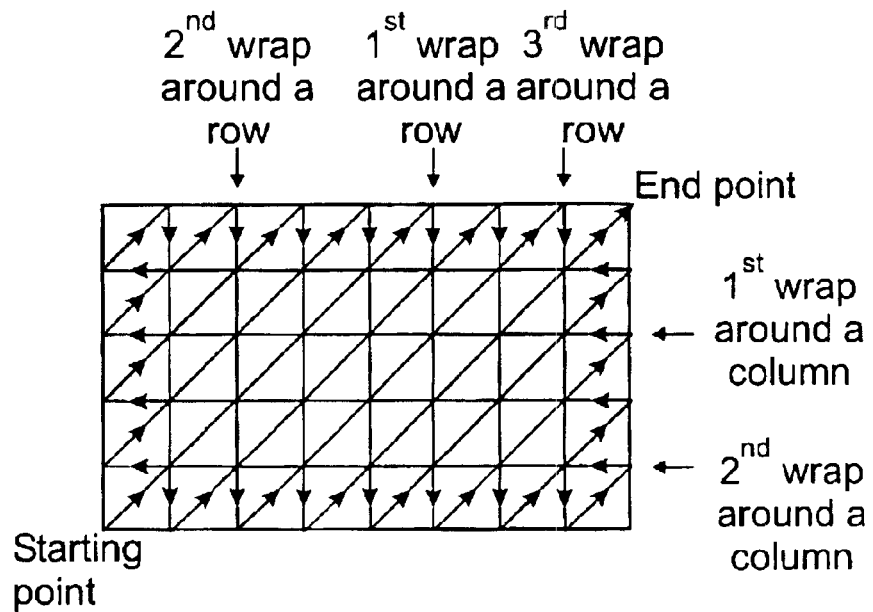
Figure 6B:
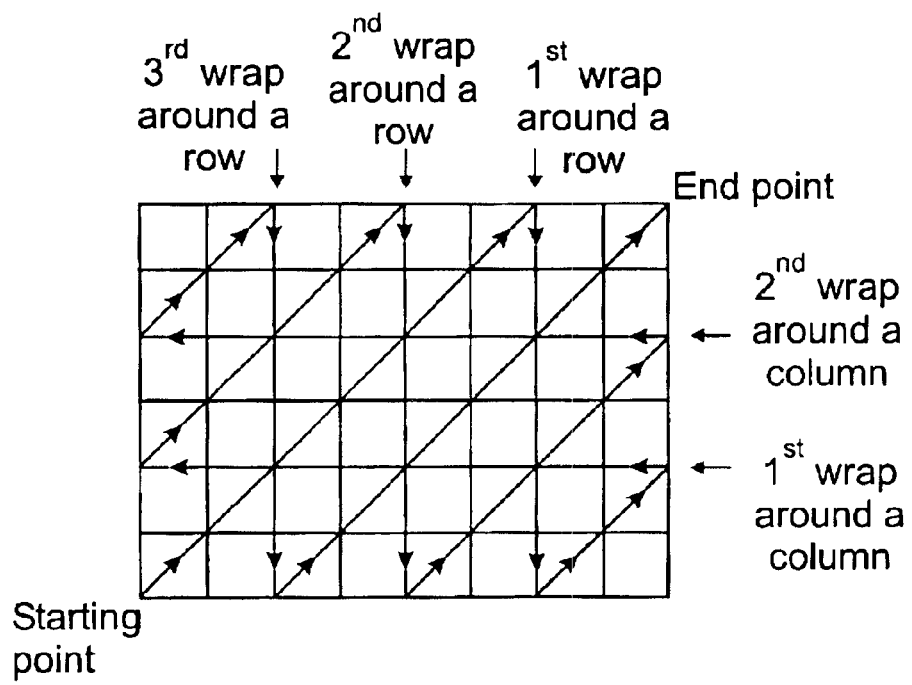

FIGS. 6a and 6b illustrate two simple cases for demonstrating the significance of equation (3). FIG. 6a illustrates the filling of a 2D array of N=8 and $P_c f_s$=5 based on the double wrap technique. Both numbers—8 and 5—are relatively prime, satisfying the condition of equation (3). Starting with element (1, 1) and filling the 2D array as described above the entire array is filled successfully when the last element (8, 5) is filled.

FIG. 6b illustrates the second case, where N=8 and $P_c f_s$=6. Here, the condition of equation (3) is violated, since the greatest common divisor is 2—greater than 1. Starting with the first element (1, 1) and filling the array as described above there are still empty spaces remaining by the time the last element (8, 6) is filled. The empty spaces will not be filled even if the process is continued beyond filling of the last element. An analytical proof of this phenomenon is found on the basis of number theory.

In the above description of the coherent k-space synthesis it was assumed that the period of organ motion is $P_c$. However, in MRI cardiac imaging there are two periodic motions apparent, the heart and the respiratory motion. In this case, the effective period of the two periodic motions is determined as follows. With $f_{ecg}$ and $f_{breath}$ being the cardiac (E.C.G.) and respiratory frequencies, respectively, the following equation (4) identifies two integers, m and n such that $$P_c = \frac{n}{f_{ecg}} = \frac{m}{f_{breath}}. \quad (4)$$

Figure 7A:
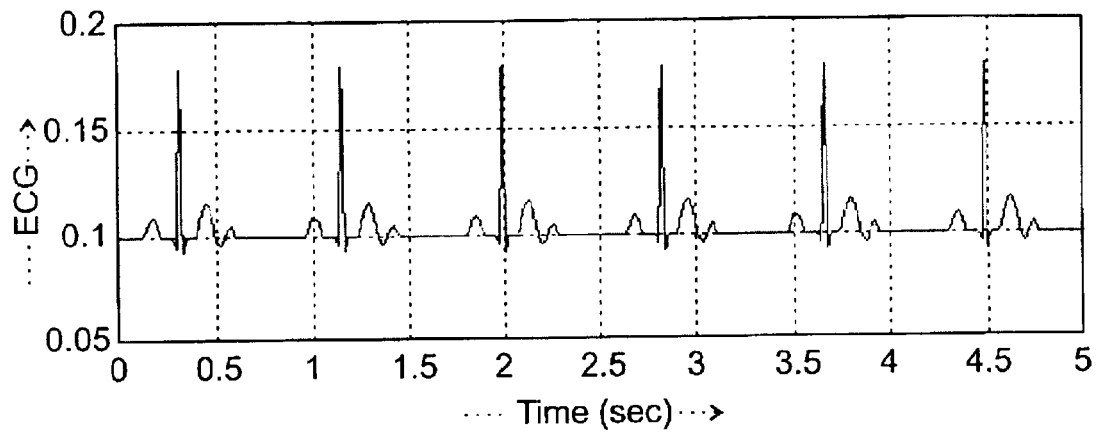
FIG. 7 are diagrams illustrating 2 periodic signals and the combined signal.
Figure 7B:
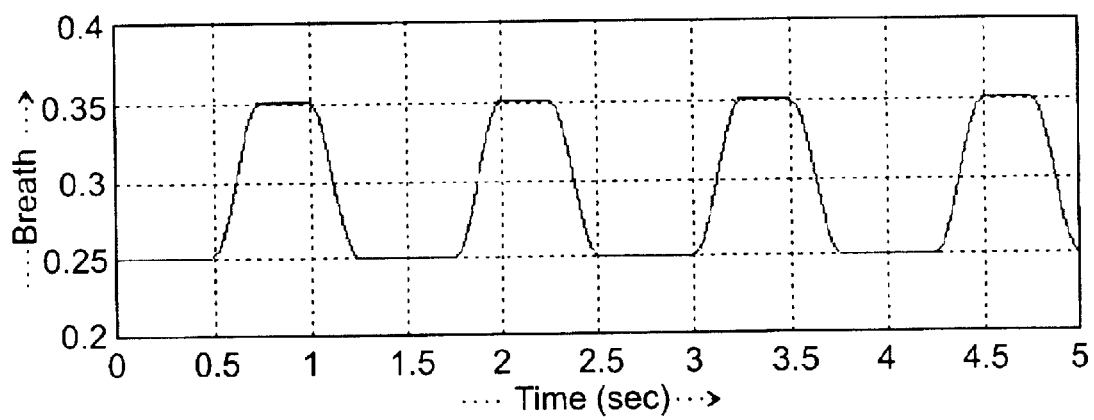
Figure 7C:
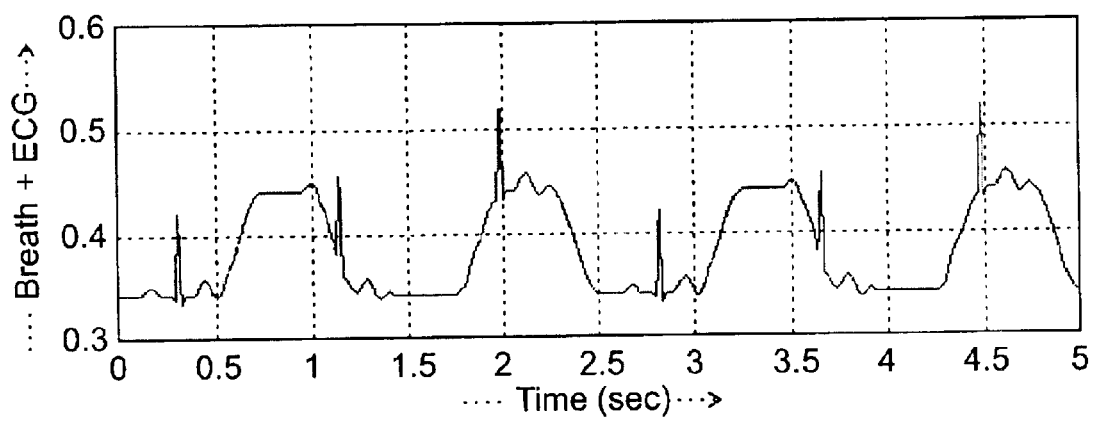

Equation (4) indicates that n cardiac cycles and m respiratory cycles take the same amount of time and the process is repeated thereafter. This amount of time is the combined or effective period $P_c$ of both periodic motions, as illustrated in FIG. 7. The diagram at the top shows an ECG signal with a frequency of 1.2 Hz, the diagram in the middle shows a respiratory signal having a frequency of 0.8 Hz. The effective period of the combined signal shown in the bottom diagram is 2.5 seconds according to equation (4).

During MRI data acquisition, it is possible to employ biofeedback for measuring the respiratory rate $f_{breath}$. Knowing the two frequencies $f_{breath}$ and $f_{ecg}$, the two integers m and n are found which satisfy equation (4) and then the parameters $P_c$, $f_s$ and N are determined. Table 1 below lists few cases of different values of the respiratory frequency $f_{breath}$ and a cardiac frequency $f_{ecg}$=1.2 Hz. First the integers m and n are found and the corresponding values of $f_s$ and $P_c$ are determined. In this case N is assumed to be 256.

TABLE 1

| $f_{ecg}$ (Hz) | $f_{breath}$ (Hz) | (m, n) | $P_c$ (Sec) | $f_s$ (Hz) | $P_c f_s$ | Scan time $NP_c$ (Minutes) | Total no. of images $P_c f_s$ |
|---|---|---|---|---|---|---|---|
| 1.2 | 0.3 | (1, 4) | 1/0.3 | 87.3 | 291 | 14.22 | 291 |
| 1.2 | 0.4 | (1, 3) | 1/0.4 | 87.6 | 219 | 10.67 | 219 |
| 1.2 | 0.6 | (1, 2) | 1/0.6 | 87.0 | 145 | 7.11 | 145 |
| 1.2 | 0.8 | (2, 3) | 1/0.4 | 87.6 | 219 | 10.67 | 219 |
| 1.2 | 0.9 | (3, 4) | 1/0.3 | 87.3 | 291 | 14.22 | 291 |

Figure 8A:
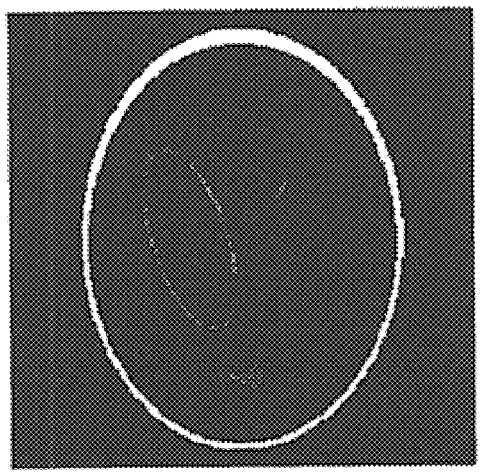
FIGS. 8a to 8c are diagrams illustrating reconstructed images of the Shepp Logan phantom without motion correction and with motion correction according to the invention.
Figure 8B:
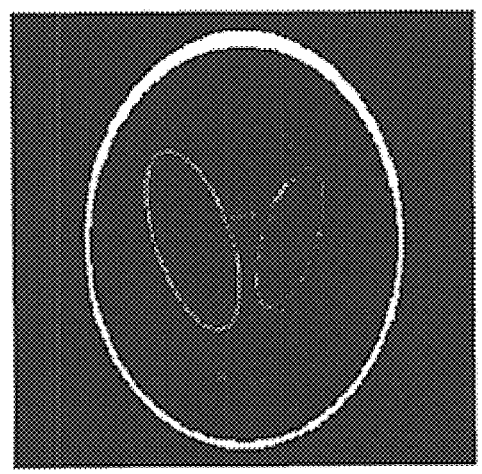
Figure 8C:
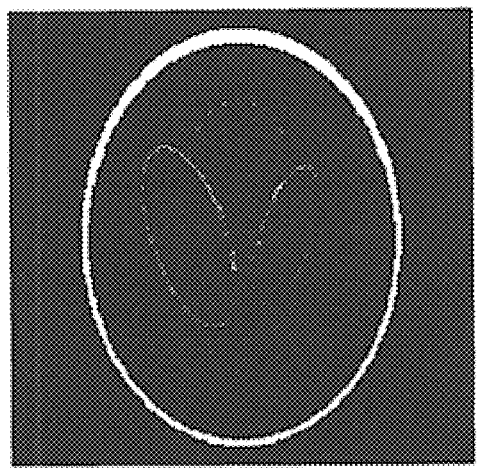

Referring to FIGS. 8a to 8c, results of a MRI simulation study using the Shepp Logan phantom are shown. The Shepp Logan phantom comprises a plurality of ellipses, with one of the ellipses experiencing two types of motion—deformation and translation. Both motions were periodic with frequencies of 1.2 and 0.4 Hz, respectively, simulating cardiac and respiratory motion corresponding to the second data row in Table 1. The MRI data acquisition process was simulated at a sampling frequency $f_s$ of 87.6 Hz. In FIG. 8a the projection of the images of the entire cycle are shown to emphasize the extent of the motion. FIG. 8b shows an image reconstructed without motion correction. In this case the motion artifacts are apparent. On the same datasets the coherent k-space synthesis process according to the invention has been applied reconstructing 219 images showing the moving ellipse in different phases of its complex motion cycle. One of these images is shown in FIG. 8c. As is evident, the image does not include the blurring shown in FIG. 8b, indicating a successful removal of motion artifacts.

Figure 9:
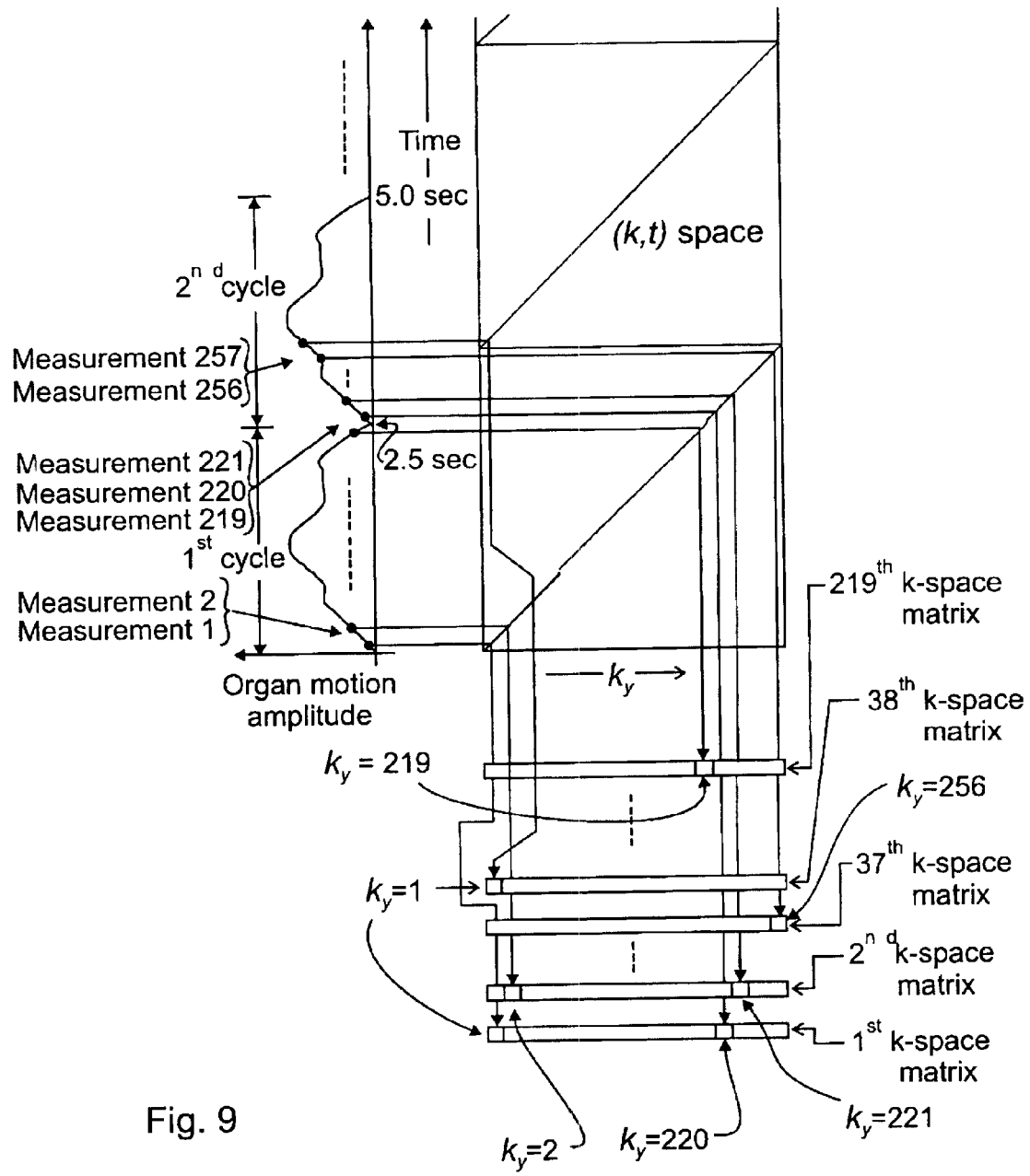
FIGS. 9 and 10 are diagrams schematically illustrating the arrangement of MRI measurements according to the invention.

FIG. 9 illustrates a schematic representation of the implementation of the re-arrangement of the $k_x[n]$ (n=1,2, ... ) rows as part of the coherent k-space synthesis according to the invention showing the grouping of the MRI measurements in different k-space matrices and re-arranging these measurements within the respective matrix according to equations (1) and (2), respectively. It is noted that in the simulation example shown in FIGS. 8a to 8c, $P_c f_s$=219 and N=256, which are relatively prime. Therefore, all k-space matrices will be filled completely. The first measurement $k_x[1]$ is allocated to the $1^{st}$ k-space matrix at location 1, the second measurement $k_x[2]$ is allocated to the $2^{nd}$ k-space matrix at location 2 and similarly, the $219^{th}$ measurement $k_x[219]$—the last measurement during the first cycle of organ motion—is allocated to the $219^{th}$ k-space matrix at location 219. The measurement $k_x[220]$ is the first measurement of the second cycle of organ motion, thus, it is placed in the $1^{st}$ k-space matrix—equation (1) mod(220−1, 219)+1=1—at location 220.

Similarly, the $221^{st}$ measurement is placed in the $2^{nd}$ k-space matrix—mod(221−1, 219)+1=2—at location 221. The $256^{th}$ measurement is placed in the $37^{th}$ k-space matrix—mod(256−1, 219)+1=37—at location 256, the last row of this matrix. The next measurement 257 is placed in the $38^{th}$ k-space matrix at location 1—equation (1) mod (257−1, 219)+1=38 and equation (2) mod(257−1, 256)+1=1. This process is continued until all matrices are filled completely.

Figure 10:
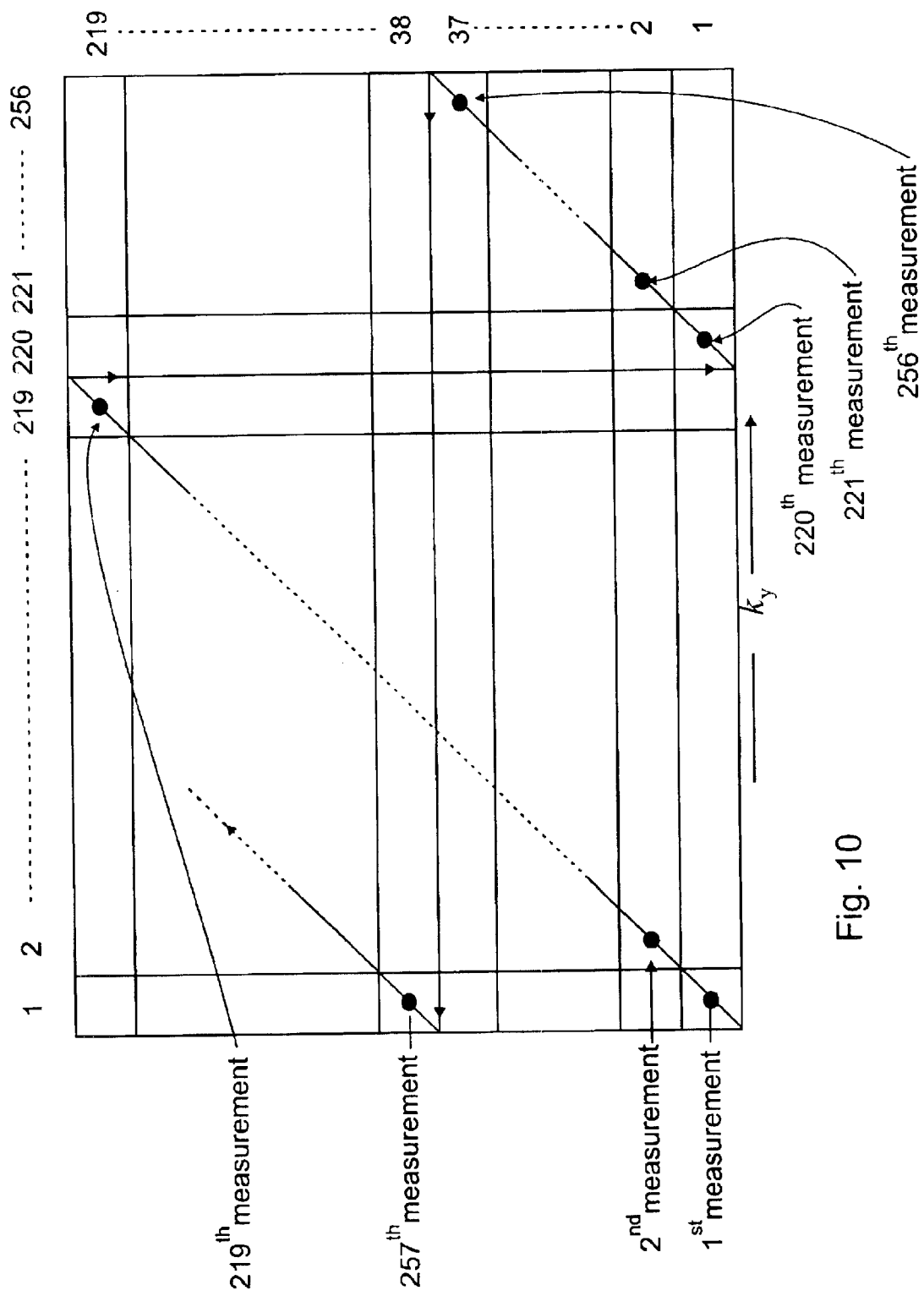

The re-arrangement of the MRI measurements $k_x[n]$ (n=1, 2, ... ) using the double wrap process according to the invention is shown in FIG. 10. FIG. 10 illustrates a 2D k-space matrix with 219 rows—$P_c f_s$—and 256 columns—N. The double wrap process is repeated until the last measurement—256×219=56064—is placed in the $219^{th}$ k-space matrix at location 256. At the end of the re-arrangement process the 219 k-space matrices are filled and the 2D-IFFT of the 219 k-space matrices yields 219 reconstructed MRI images.

Figure 11:
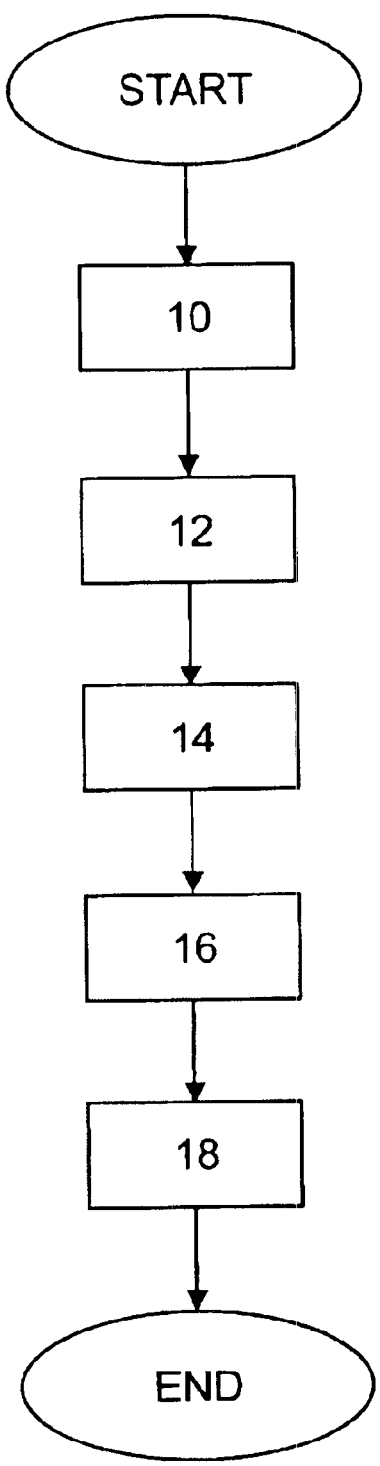
FIG. 11 is a simplified flow diagram illustrating a first embodiment of a method for correcting organ motion according to the invention.

Referring to FIG. 11 a simplified flow diagram illustrating the principal processing steps of a first embodiment of a method for correcting organ motion according to the invention is shown. A plurality of sets of the MRI measurement data indicative of at least an image of an object are received—box 10. Each set corresponds to one row $k_x$ of a k-space matrix of at least a k-space matrix. Upon receipt, for each set of the plurality of sets of the MRI measurements a k-space matrix of the at least a k-space matrix are determined for allocation thereto based on motion data indicative of the motion of the object occurring during acquisition of the plurality of sets of the MRI measurement data—box 12. In a following step, for each set of the plurality of sets of the MRI measurement data a location within the k-space matrix allocated thereto is determined—box 14. Based on the sets of the plurality of sets of the MRI measurement data allocated thereto at least a k-space matrix is generated—box 16. Inverse Fourier transforming the at least a k-space matrix results in at least a reconstructed MRI image of the object—box 18.

Figure 12:
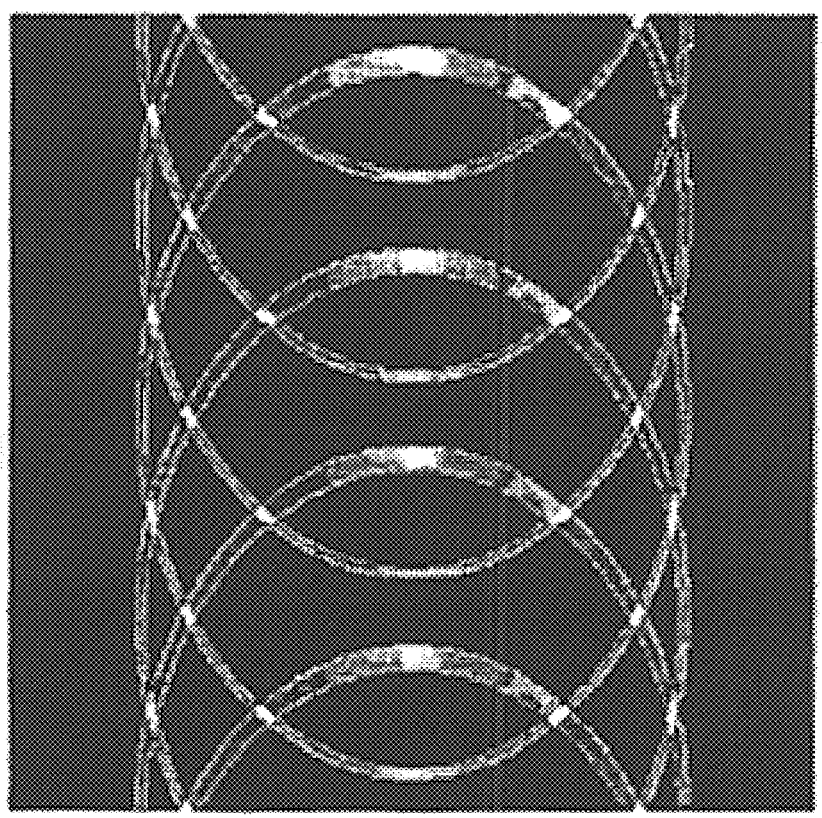
FIG. 12 is a diagram illustrating the effect of partial filling of the k-space matrix on the reconstructed image.
Figure 13:
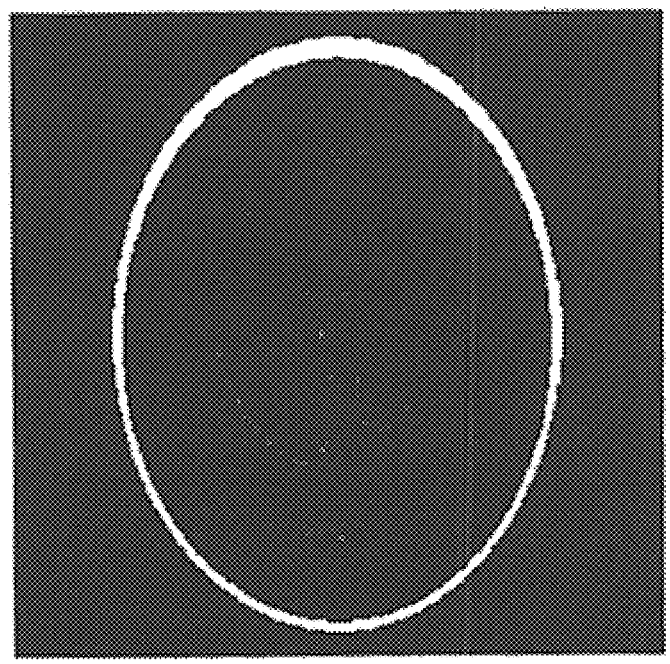
FIG. 13 is a diagram illustrating the effect of a mismatch in cardiac frequency on the reconstructed image.

Although the above process is successful in correcting motion artifacts, it is sensitive to a mismatch of the parameters $f_{ecg}$, $f_{breath}$, $P_c$, and $f_s$. A mismatch of these parameters has possible negative effects on the reconstructed images. For example, if the sampling frequency shifts to 88.0 Hz, instead of 87.6 Hz, the condition of equation (3) is violated. As a result the k-space matrices are not filled completely resulting in spatial aliasing in the reconstructed images as depicted in FIG. 12. Similar impacts on the reconstructed images have errors in assessing the cardiac and respiratory frequencies. For example, if the cardiac frequency is assessed to be 1.21 Hz instead of the measured 1.2 Hz the reconstructed image includes artifacts as illustrated in FIG. 13. Similar effects are observed due to errors in the respiratory frequency.

Figure 14:
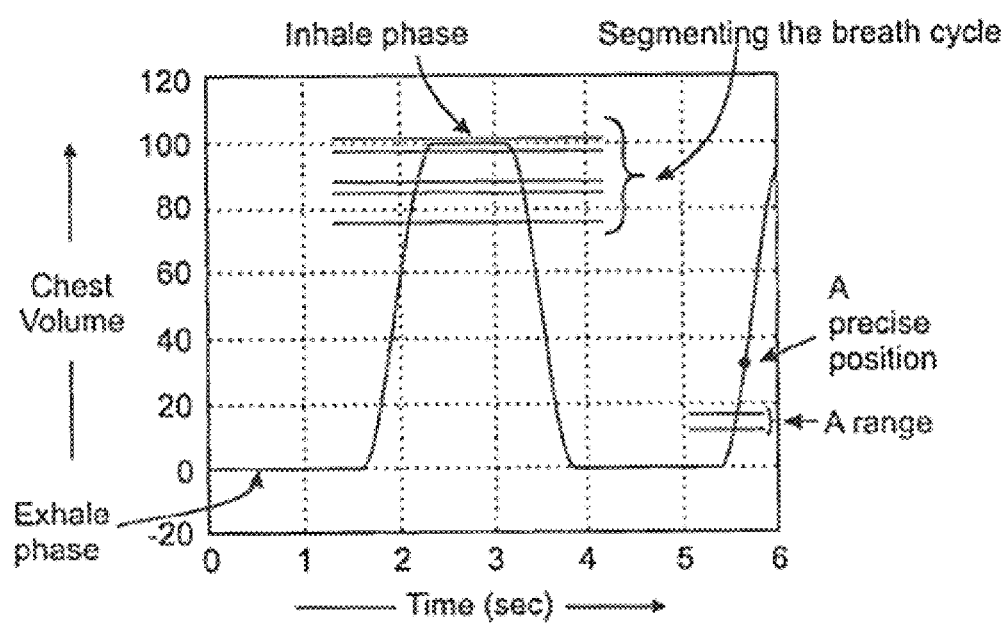
FIG. 14 is a simplified diagram illustrating characteristics of a typical respiratory signal.
Figure 15:
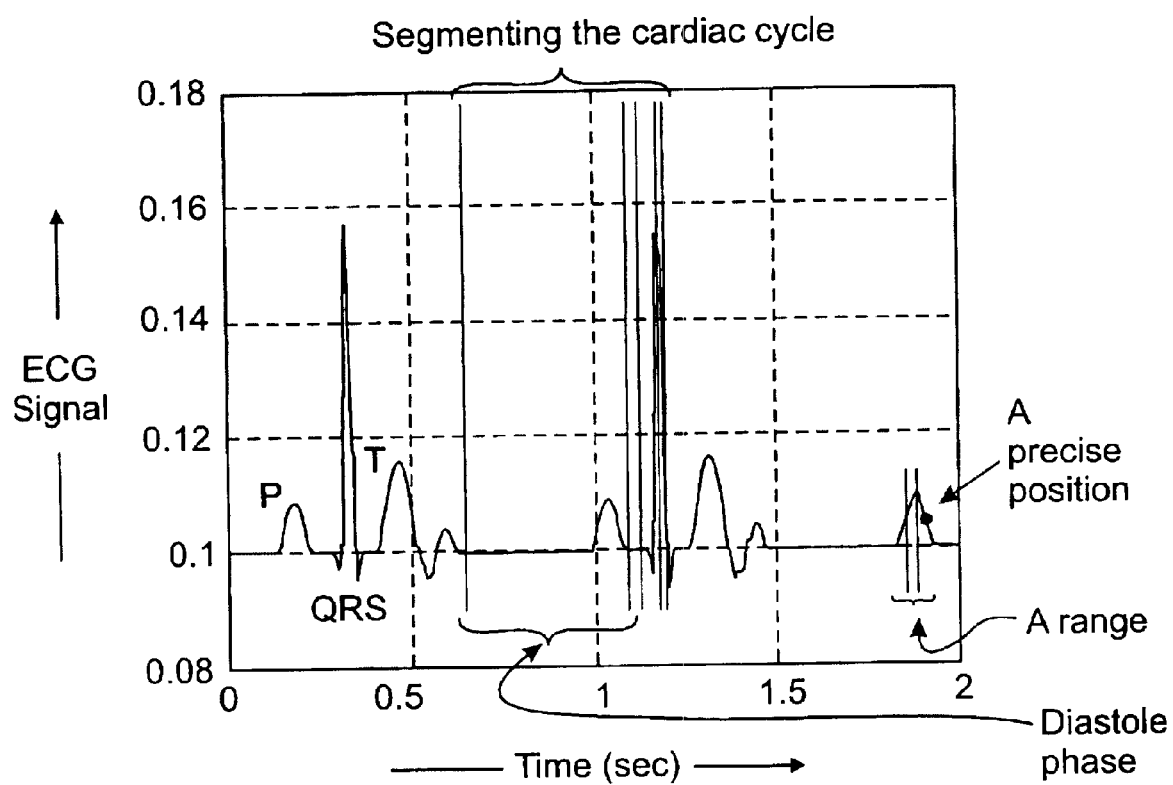
FIG. 15 is a simplified diagram illustrating characteristics of a typical ECG signal.

For example, it is known that the cardiac frequency $f_{ecg}$ can drift from its initially measured value during the MRI data acquisition process. Thus equation (4) is not satisfied even if the respiratory frequency $f_{breath}$ remains the same. This limitation is overcome by a second embodiment of the method for correcting organ motion according to the invention based on the coherent k-space synthesis which allows drifts and mismatches in the above mentioned physiological parameters. Here, instead of assuming a precise cardiac and respiratory frequency, a relative range of the phases of the heart and lung motion is determined as illustrated in FIGS. 14 and 15. Thus, if the heart and lung phases fall within the determined ranges, the measurements collected during these ranges are used for image reconstruction.

Figure 16:
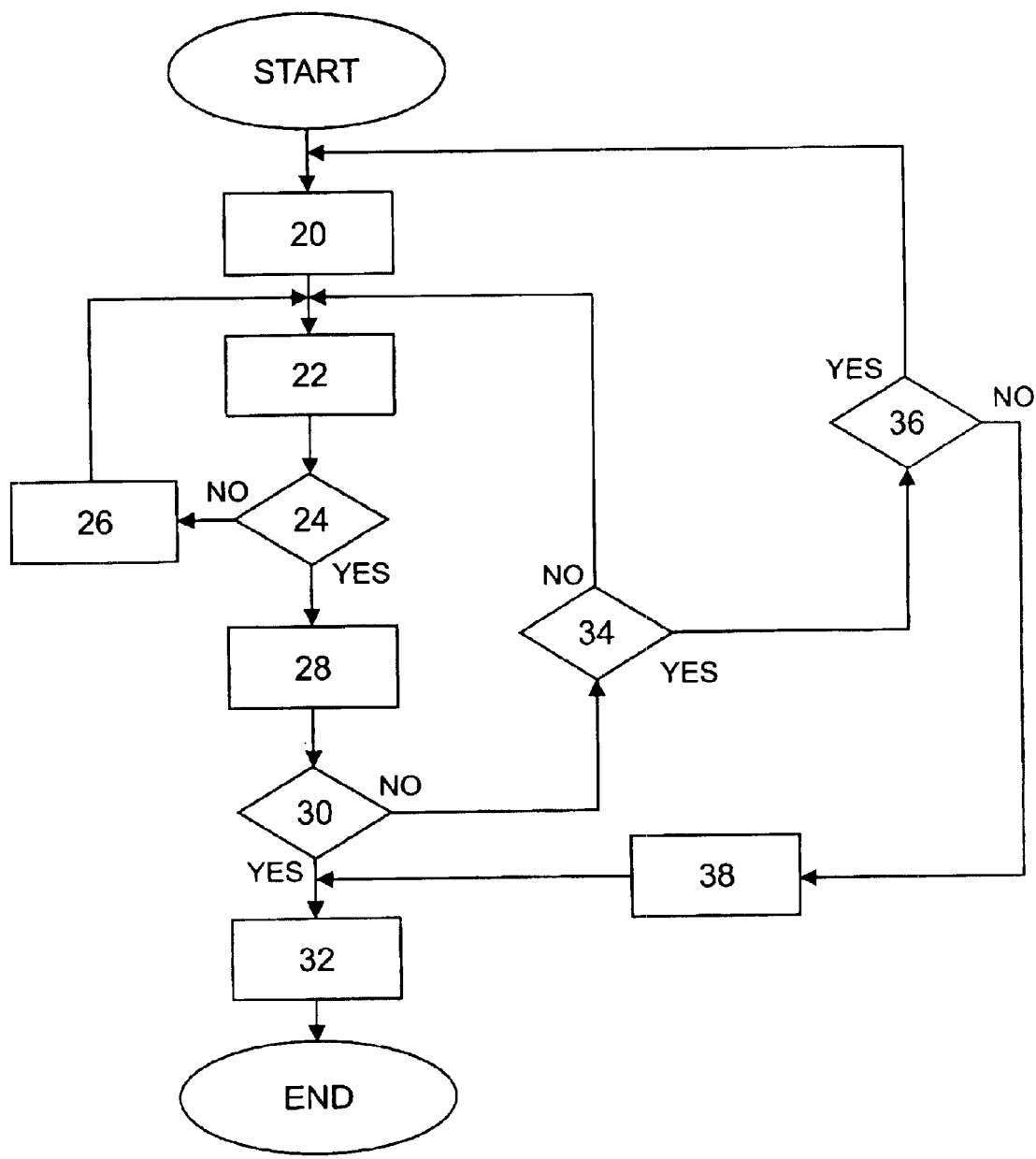
FIG. 16 is a simplified flow diagram illustrating a second embodiment of a method for correcting organ motion according to the invention.

More specifically, the second embodiment of the method for correcting organ motion according to the invention comprises the following processing steps, as shown in the flow diagram of FIG. 16. During the MRI data acquisition process a patient's ECG and respiratory signals are collected simultaneously with the MRI measurement signal. The MRI measurement signal comprises a plurality of sets of the MRI measurement data indicative of at least an image of an object. Each set corresponds to one row $k_x$ of a k-space matrix of at least a k-space matrix. All three signals are collected for a given period of time and stored in a database. Preferably, the sampling frequency of the three signals is the same. Following the acquisition of the three signals, the phases of the cardiac and respiratory cycles are selected and respective ranges are determined—box 20. MRI measurement data are then retrieved from the database—box 22. In box 24 the data corresponding to a set is processed to determine if it falls within the determined ranges of the cardiac and respiratory cycles. Sets not falling within the ranges are discarded—box 26—and another set is retrieved. The selected sets falling within the determined ranges are then re-arranged in at least a k-space matrix based on the coherent k-space synthesis according to the invention—box 28. If the at least a k-space matrix is filled completely—box 30—2D inverse Fourier transformation—box 32—yields a reconstructed MRI image of the object, for example, a slice through a patient's chest showing the heart and lung frozen at the selected phase. If the at least a k-space matrix is not filled completely and all sets of MRI measurements are retrieved—box 34—two options remain. Firstly, if it is desirable to select another phase of the cardiac and/or respiratory cycles or increase the ranges of the selected phases—box 36—the above process is repeated from box 20. Secondly, if this is not desirable, missing elements of the k-space matrix are filled by interpolating between adjacent sets of MRI measurements—box 38.

These steps are repeated for different physiological phases in order to reconstruct different images showing the heart and lung frozen at different phases of their complex motion.

Optionally, the characteristics of normal breathing cycles are exploited in order to reconstruct images without motion artifacts. The transition between the exhale phase and the inhale phase is shorter compared to the time spent in the exhale and inhale phases itself. The duration of the exhale phase is longer than the duration of the inhale phase. During the exhale and the inhale phases the chest volume is substantially not changing, as shown in FIG. 14, hence there is no movement caused by respiration. The transition between the two phases is symmetric, as illustrated in FIG. 14.

Exploiting the above characteristics of the breathing cycles, further provides means for minimizing the MRI data acquisition period for the k-space synthesis according to the invention. For example, by selecting the exhale phase it is possible to allocate maximum time for imaging different phases of the cardiac cycle as this phase is the longest in time and there is little respiratory motion during this phase. During the diastole phase of the cardiac cycle there is the least movement of the heart. Therefore, total scan time is substantially reduced by acquiring MRI measurements when the exhale phase of the breathing cycle coincides with the diastole phase of the cardiac cycle, because it is most likely that the k-space matrix is filled more quickly than in any other physiological state.

The state of the lung during a breathing cycle is generally specified by the chest volume versus time. As a result, the lung is considered to be in the same state for a given volume whether the volume is encountered during exhale-to-inhale transition or inhale-to-exhale transition, as illustrated in FIG. 14. On the other hand, the ECG signal is complex compared to the respiratory signal and the heart is likely in different states for a same value of the ECG signal, shown in FIG. 15. Consequently, while determining a proper range of the cardiac and the respiratory cycle—step 2 above—it is more appropriate to determine the range of the cardiac cycle along the time axis whereas the range of the respiratory cycle is determined along the chest volume axis as illustrated in FIGS. 14 and 15. This ensures that the heart and the lung are always in a same state whenever the predetermined cardiac and respiratory phase is reached.

Figure 17:
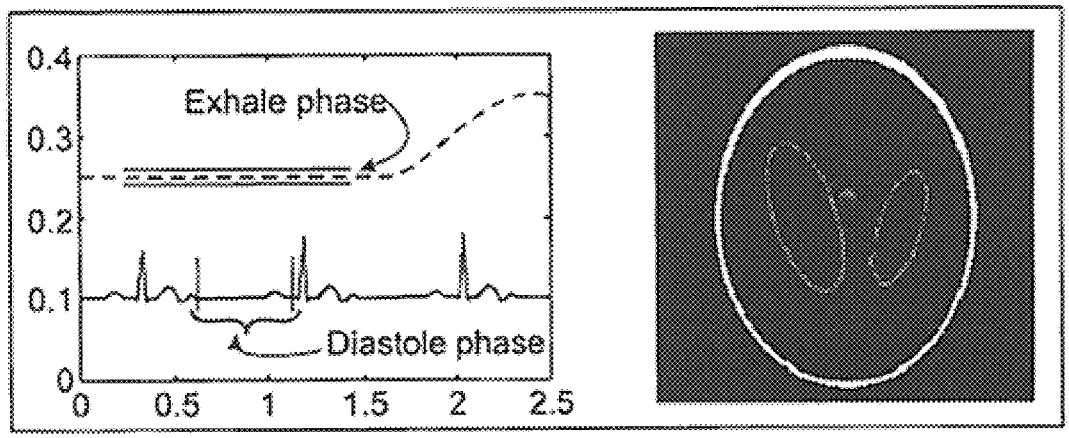
FIGS. 17 and 18 are simplified diagrams illustrating selected phases of respiratory and cardiac cycles according to the invention.

A second set of simulations has been conducted using the above mentioned Shepp-Logan phantom. All the ellipses but one were assumed stationary with the one ellipse going through deformation and translation, representing cardiac and respiratory motion, respectively. In this second set of simulations the frequencies of the periodic deformation and translation of the smaller ellipse have been changed slowly during the MRI data acquisition period, varying the cardiac frequency from 60 to 80 Hz and the respiratory frequency from 0.1 to 0.4 Hz. The variation of the cardiac and the respiratory frequencies was not synchronized. The MRI data acquisition process was simulated at a sampling frequency of 100 Hz. For the case of the exhale phase of the respiratory cycle coinciding with the diastole phase of the cardiac cycle it was possible to collect the MRI measurements needed to fill a k-space matrix of 128×128 completely in the short time of 12 seconds. During the 12 second period 1200 measurements have been acquired by the MRI system of which 128 measurements corresponding to coinciding exhale and diastolic phases have been selected for reconstructing a 128×128 image using the coherent k-space synthesis according to the invention. The reconstructed image and the corresponding phases of the cardiac and respiratory cycles are shown in FIG. 17.

As is evident, for reconstructing images of 256×256 or 512×512 size, the MRI data acquisition period is longer. The data acquisition times for various image sizes are summarized in Table 2.

TABLE 2

| Image Size | MRI Scan Time $NP_c$ (Seconds) | Percentage of acquired MRI data used |
|---|---|---|
| Cardiac Diastole Phase | | |
| 128 × 128 | 35 | 3.8% |
| 256 × 256 | 66 | 3.9% |
| 512 × 512 | 124 | 4.1% |
| Cardiac Accelerated Phase During QRS Complex | | |
| 128 × 128 | 3600 | 0.024% |
| 256 × 256 | 5400 | 0.021% |
| 512 × 512 | 6840 | 0.019% |

Figure 18:
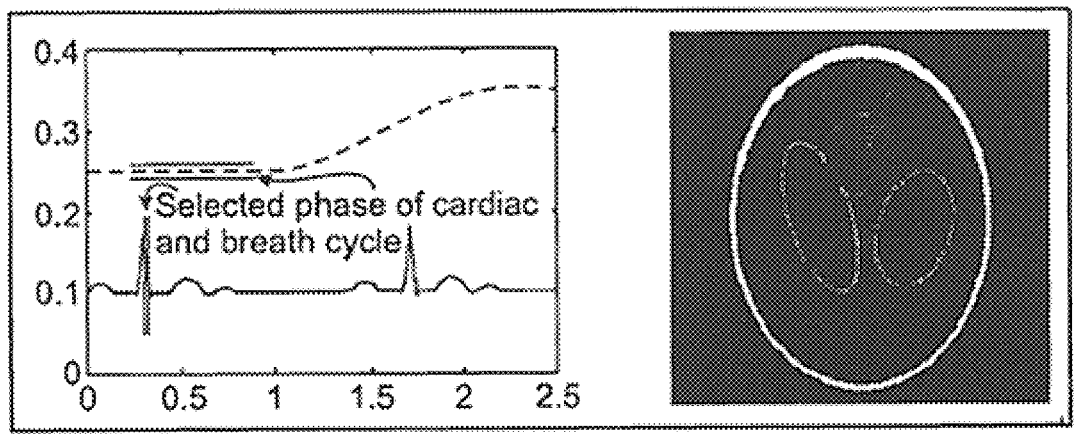

It is important to note that the second embodiment of the method for correcting organ motion according to the invention is also applicable for reconstructing images from MRI measurements acquired during accelerated cardiac phases, by selecting a very short range—e.g. 0.4% of the cardiac cycle—as shown in FIG. 18. The measurement process requires longer periods of MRI data acquisition. A reconstructed image and the corresponding selected phases are shown in FIG. 18.

The method for correcting organ motion according to the invention is highly beneficial in providing a method capable of substantially removing motion artifacts due to cardiac and respiratory motion. Through careful selection of the phases of the cardiac and respiratory cycles and corresponding ranges MRI data acquisition periods are of the order of seconds or a few minutes. For example, this is highly beneficial in numerous emergency situations where provision of artifact free MRI imaging data within minutes is enabling a medical practitioner to take life saving action based on this information. Furthermore, integration of motion artifact free MRI images of different phases of organ motion using the coherent k-space synthesis according to the invention allows, for example, a 3D animation—2D time varying images—showing different phases of the cardiac or lung cycle. Yet further, combining MRI measurements and subsequent data processing according to the invention for reconstructing images of different slices provides a 4D animation—3D time varying images.

Another aspect of the invention is related to the correction of motion artifacts due to head motion, for example, experienced during MRI data acquisition for imaging a human brain. The head motion, unlike the cardiac and respiratory motion, is a random motion comprising an infinite number of harmonics as compared to two harmonics for the combination of the cardiac and the respiratory motion. However, it is possible to consider the head motion a rigid body motion comprising translation and rotation. If the motion vector describing the translation and rotation of the head is tracked during the MRI data acquisition process it is possible to correct the MRI measurement data using the coherent k-space synthesis according to the invention. The head motion is tracked, for example, using infra red markers placed on a patient's head and a tracking camera or, alternatively, using a laser beam reflected by a mirror placed on the patient's head.

In order to correct the MRI data head motion is recorded continually during the MRI data acquisition process. At time $t_i$ the motion data comprises, for example, the coordinates $x(t_i)$, $y(t_i)$ and the angle $\theta(t_i)$. At the same time instance $t_i$ the MRI data comprise a row $k_x(t_i)$ of the k-space matrix. It is noted that a position vector $\vec{x}_{object}$ indicating a location with respect to a coordinate system fixed with a patient's head is transformed into a vector $\vec{x}_{MR}$ indicating the same location with respect to a stationary MRI coordinate system as follows:

$$\vec{x}_{MR} = R * \vec{x}_{object} + \vec{s},$$

$$\text{where } \vec{s} = \begin{bmatrix} x \\ y \end{bmatrix} \text{ and } R = \begin{bmatrix} \cos\theta & -\sin\theta \\ \sin\theta & \cos\theta \end{bmatrix}.$$

At time $t_0$, the object's position in the MRI's stationary coordinate system is described by the vector $$\vec{x}_{MR}(t_0) = R(t_0) * \vec{x}_{object} + \vec{s}(t_0),$$

and at time $t_i$, the object's position is described by the vector $$\vec{x}_{MR}(t_i) = R(t_i) * \vec{x}_{object} + \vec{s}(t_i).$$

Based on the above two equations, the object's position in the stationary MRI's coordinate system at time $t_i$ is transformed into its position at time $t_0$ as follows:

$$\vec{x}_{MR}(t_0) = R(t_0)R^{-1}(t_i) * [\vec{x}_{MR}(t_i) - \vec{s}(t_i)] + \vec{s}(t_0). \quad (5)$$

The process for correcting the head motion according to the present invention is described in the following. Knowing that the set of MRI measurement data $k_x(t_i)$ at time $t_i$ is located in the $i^{th}$ row of the k-space matrix, an $i^{th}$ k-space matrix $M_i$ is constructed as follows:

$$M_i = \begin{bmatrix} 0 & 0 & 0 & \cdots & 0 \\ 0 & 0 & 0 & \cdots & 0 \\ \vdots & \vdots & \vdots & \vdots & \vdots \\ - & - & k_x(t_i) & - & - \\ \vdots & \vdots & \vdots & \vdots & \vdots \\ 0 & 0 & 0 & \cdots & 0 \end{bmatrix},$$

with $k_x(t_i)$ forming the $i^{th}$ row and the remaining elements being zero.

Inverse Fourier transformation of the matrix $M_i$ provides an image portion $S_i$ in spatial domain corresponding to $k_x(t_i)$.

Using equation (5) the spatial domain image portion $S_i$ is transformed into its position at time $t_0$ generating an image portion $S_i^{t_0}$.

This process is repeated for a plurality of sets of MRI measurement data and a spatial domain image $S^{t_0}$ is reconstructed by superposing the transformed image portions $S_i^{t_0}$ as follows:

$$S^{t_0} = \sum_{i=1}^{N} S_i^{t_0}.$$

Due to translation and rotation in the transformation process of equation (5) grid locations of the transformed image portions $S_i^{t_0}$ do not coincide with the grid locations of the spatial domain image $S^{t_0}$. Therefore, the transformed image portions $S_i^{t_0}$ are re-grid using, for example, linear interpolation or nearest neighbor techniques prior superposition. The nearest neighbor technique is faster, however, the linear interpolation produces more accurate results.

Figure 19:
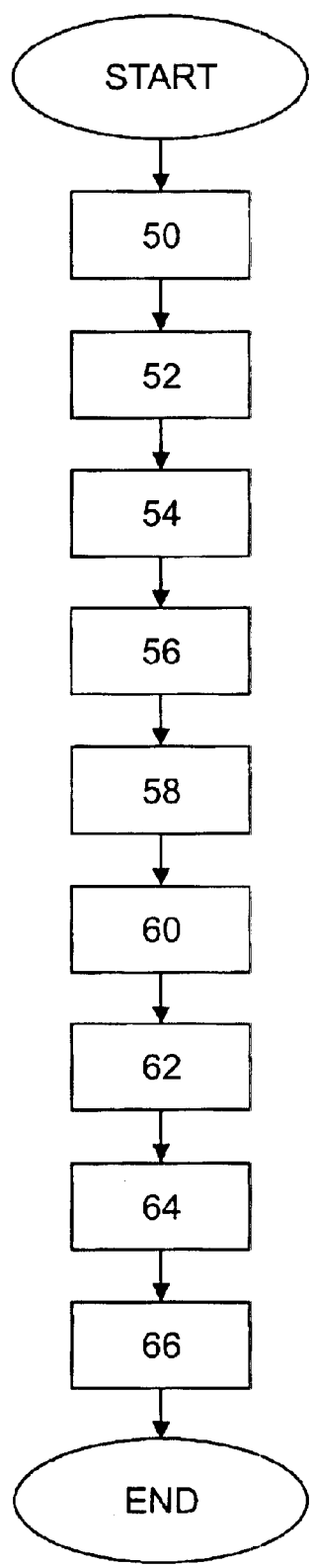
FIG. 19 is a simplified flow diagram illustrating a third embodiment of a method for correcting organ motion according to the invention.

Referring to FIG. 19 a simplified flow diagram illustrating the principal processing steps of a third embodiment of a method for correcting organ motion according to the invention is shown. A plurality of sets of the MRI measurement data indicative of at least an image of an object are received—box 50. Each set corresponds to one row $k_x$ of a k-space matrix of at least a k-space matrix. Further, motion data indicative of translational and rotational motion of a patient's head are received—box 52. The motion data are indicative of the patient's head motion during acquisition of the plurality of sets of the MRI measurements. Upon receipt, for each set of the plurality of sets of the MRI measurements a k-space matrix of the at least a k-space matrix is determined for allocation thereto based on the motion data—box 54. In a following step, for each set of the plurality of sets of the MRI measurement data a location within the k-space matrix allocated thereto is determined—box 56. Based on the sets of the plurality of sets of the MRI measurement data allocated thereto at least a k-space matrix is generated—box 58. The at least a k-space matrix comprises an MRI measurement data set corresponding to an image portion. Inverse Fourier transforming the at least a k-space matrix results in at least a reconstructed image portion of a MRI image of the object—box 60. The at least a reconstructed image portion is then transformed for correcting translational and rotational motion during the MRI data acquisition process—box 62. A final reconstructed MRI image of an object is obtained by superposing the at least a reconstructed image portion—box 66. Prior the superposition the transformed at least an image portion is processed using, for example, linear interpolation to coincide with an image grid location of the final image—box 64.

The above embodiment has been described in connection with the reconstruction of a 2D MRI image for simplicity but is easily expandable for the motion correction of 3D images.

Application of the above embodiment for correcting organ motion according to the invention substantially removes artifacts in MRI images of a patient's brain due to head motion. FIGS. 20a to 20e illustrate simulation results of a phantom while the phantom was moving—rotating as well as translating—and its motion vector has been recorded. Using this motion information the MRI measurement data have been corrected as disclosed above. FIGS. 20a and 20c show the stationary phantom at the beginning and the end of the data acquisition process, while FIG. 20b illustrates the range of the motion of the phantom. FIG. 20d illustrates an image reconstructed using uncorrected MRI data. FIG. 20e illustrates an image reconstructed using MRI data corrected based on the correction method according to the invention.

In another test the phantom was a spherical balloon of ≈45 mm in diameter filled with water. The field of view was 128×128 mm. the phantom was moved to the right by a distance of 14 mm during the MRI data acquisition. The motion of the phantom was tracked using a pair of cameras during the MRI data acquisition. Full sets of data were also acquired at the initial and final position of the phantom—the phantom being stationary at these positions—for reference. The MRI data for image reconstruction of the moving phantom has been corrected using the correction method according to the invention using the motion vector provided by the signal data of the two cameras. Results of this experiment are shown in FIGS. 21a to 21f. FIG. 21a shows the displacement of the phantom along the x-axis versus time. FIGS. 21b and 21c are the reconstructed images of the phantom while stationary at the starting and ending positions, respectively. FIG. 21d illustrates a reconstructed MRI image of the moving phantom without motion correction. FIGS. 21e and 21f are the reconstructed images of the moving phantom where the MRI data have been corrected with respect to the starting and ending positions, respectively. FIGS. 21e and 21f clearly show a substantial improvement in image quality by successfully removing motion artifacts using the correction method according to the invention compared to the uncorrected image shown in FIG. 21d.

Figure 22:
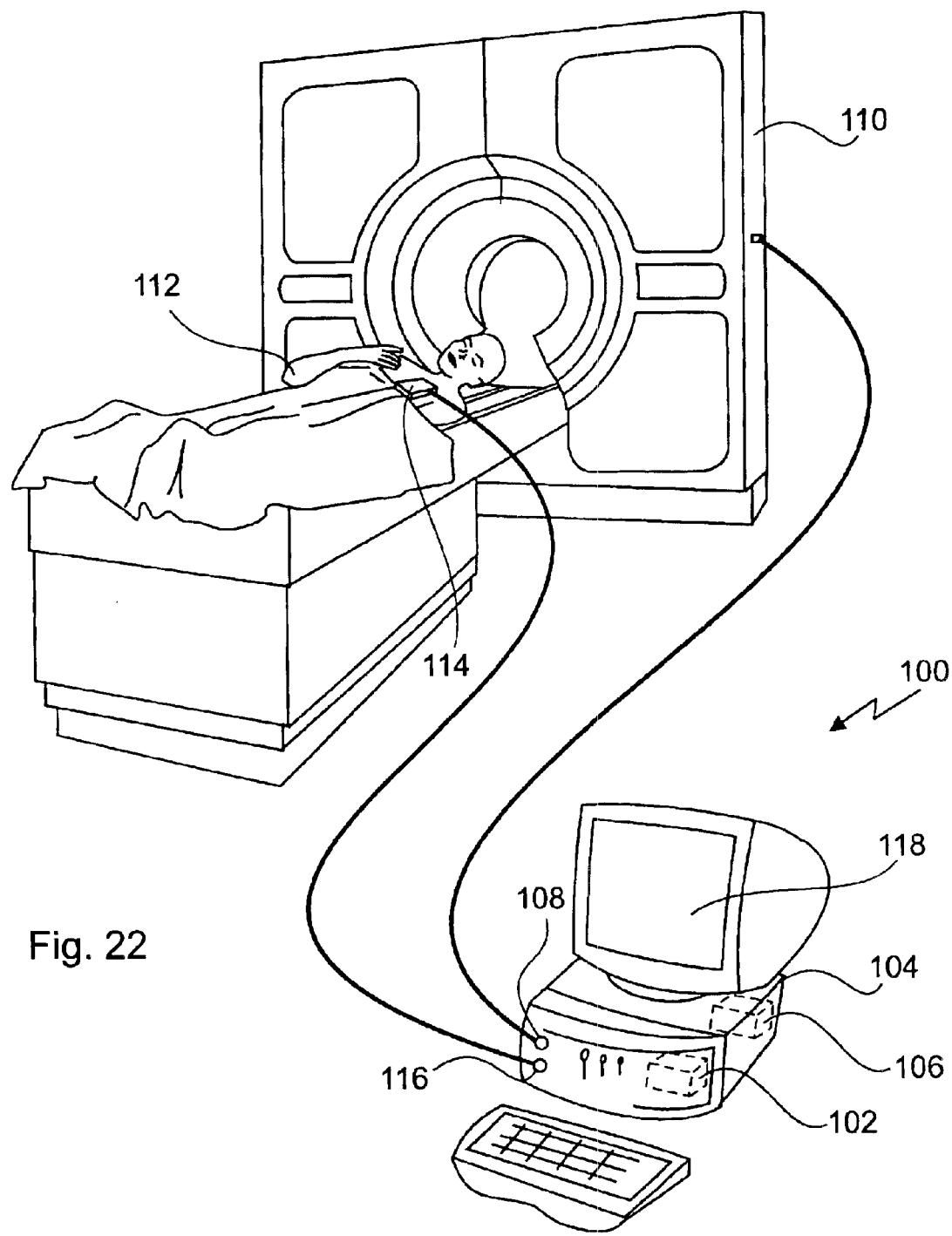

Referring to FIG. 22, a system implementation 100 of the various embodiments of the method for motion correcting MRI measurement data according to the invention is shown. For example, executable commands for execution on a processor 102 of a workstation 104 are stored in non-volatile memory 106. When executing the stored commands the processor 102 performs the processing steps of one of the above embodiments of the method for motion correcting MRI measurement data. The workstation is linked via port 108 to a MRI system 110 for data communication therewith. MRI measurement data acquired from an object 112 are transmitted via port 108 to the workstation 104 for processing. A motion sensing system 114 for acquiring a motion signal from the object 112 and for providing motion data indicative thereof is linked to the workstation 104 via port 116 for data communication therewith. The motion sensing system 114 comprises, for example, an ECG for sensing cardiac motion and an acoustic sensor for sensing respiratory motion. Alternatively, the respiratory motion is sensed based on the mass flow of air inhaled and exhaled by the patient. For brain imaging applications the motion sensing system 114 comprises a system for tracking translational and rotational motion of the patient's head. Such systems are, for example, infra red markers placed on the patient's head and a tracking camera, or alternatively, mirrors placed on the patient's head and a laser beam provided for reflection therefrom. After reconstruction the MRI images are, for example, provided to a monitor 118 of the workstation 104 for display to a medical practitioner.

Furthermore, it is possible to implement the various embodiments of the motion correction method according to the invention as retrofit into existing MRI systems, for example, as executable commands for execution on an existing signal processing system or as a workstation linked to an existing MRI system for data communication therewith.

Numerous other embodiments of the invention will be apparent to persons skilled in the art without departing from the spirit and scope of the invention as defined in the appended claims.

What is claimed is:

1. A method for motion correcting MRI measurement data comprising the steps of:
   a) receiving a plurality of sets of the MRI measurement data indicative of at least an image of an object, each set corresponding to one row $k_x$ of a k-space matrix of at least a k-space matrix;
   b) selecting for each set of the plurality of sets of the MRI measurements a k-space matrix of the at least a k-space matrix for allocation thereto;
   c) determining for each set of the plurality of sets of the MRI measurement data a location within the k-space matrix allocated thereto; and,
   d) generating at least a k-space matrix based on the sets of the plurality of sets of the MRI measurement data allocated thereto.

2. A method for motion correcting MRI measurement data as defined in claim 1 comprising the step of:
   b1) determining the k-space matrix of the at least a k-space matrix for selection based on motion data indicative of the motion of the object occurring during acquisition of the plurality of sets of the MRI measurement data.

3. A method for motion correcting MRI measurement data as defined in claim 2 wherein the motion is a periodic motion with a period of $P_c$ seconds.

4. A method for motion correcting MRI measurement data as defined in claim 3 wherein step (b1) the k-space matrix is determined in accordance with $i=\mod(n-1, P_c f_s)+1$ with i indicating the k-space matrix, n indicating the set, and $f_s$ being the sampling frequency of the MRI data acquisition process in Hz.

5. A method for motion correcting MRI measurement data as defined in claim 4 wherein step (c) the location is determined in accordance with $r=\mod(n-1, N)+1$ with r indicating the location within the allocated k-space matrix, and N indicating the total number of rows in the allocated k-space matrix.

6. A method for motion correcting MRI measurement data as defined in claim 5 wherein the parameters $P_c$ and $f_s$ are such that the greatest common divisor of $P_c f_s$ and N is one.

7. A method for motion correcting MRI measurement data as defined in claim 6 wherein N is a radix 2 number and $P_c f_s$ is an odd integer.

8. A method for motion correcting MRI measurement data as defined in claim 7 wherein the steps of (b) and (c) comprise the steps of:
   allocating a first set $k_x[1]$ to a $1^{st}$ k-space matrix as the first row forming a first element (1, 1) of a 2D array having $P_c f_s$ rows and N columns;
   continuously filling the elements of the 2D array with subsequent sets by increasing each of row number and column number of the 2D array elements by 1 until all elements of the 2D array are filled;
   filling an element in the $1^{st}$ row of a same column with a subsequent set after filling an element in the $P_c f_s^{th}$ row; and,
   filling an element in the $1^{st}$ column of a same row with a subsequent set after filling an element in the $N^{th}$ column.

9. A method for motion correcting MRI measurement data as defined in claim 2 wherein the motion comprises two periodic motions.

10. A method for motion correcting MRI measurement data as defined in claim 9 wherein the two periodic motions are cardiac motion and respiratory motion.

11. A method for motion correcting MRI measurement data as defined in claim 10 wherein the period $P_c$ is determined in accordance with $$P_c = \frac{n}{f_{ecg}} = \frac{m}{f_{breath}}$$

with $f_{ecg}$ and $f_{breath}$ being the cardiac and respiratory frequencies, respectively, and m and n are integers.

12. A method for motion correcting MRI measurement data as defined in claim 11 wherein for a given cardiac frequency $f_{ecg}$ the respiratory frequency $f_{breath}$ is determined in accordance with $$f_{breath} = \frac{m}{n} f_{ecg}.$$

13. A method for motion correcting MRI measurement data as defined in claim 2 comprising the step of: receiving motion data indicative of a motion signal acquired from the object simultaneously with the plurality of sets of MRI measurements.

14. A method for motion correcting MRI measurement data as defined in claim 13 wherein the motion signal is indicative of cardiac and respiratory motion of the object.

15. A method for motion correcting MRI measurement data as defined in claim 14 wherein the motion signal of cardiac motion is an ECG signal.

16. A method for motion correcting MRI measurement data as defined in claim 14 comprising the steps of:
   selecting phases of cardiac and respiratory cycles and determining respective ranges based on the motion data; and,
   selecting sets of the plurality of sets of the MRI measurement data being acquired during the selected phases of cardiac and respiratory cycles and falling within the ranges.

17. A method for motion correcting MRI measurement data as defined in claim 13 wherein the motion of the object is a rigid body motion and wherein the motion signal is indicative of translational and rotational motion of the object.

18. A method for motion correcting MRI measurement data as defined in claim 17 comprising the steps of:
   inverse Fourier transforming the at least a k-space matrix producing at least a reconstructed image portion of the at least an image;
   transforming the at least a reconstructed image portion for correcting at least one of translational and rotational motion; and,
   superposing the at least a transformed image portion producing the at least an image.

19. A method for motion correcting MRI measurement data as defined in claim 18 comprising the step of processing the at least a transformed image portion to coincide with a grid location of the at least an image.

20. A method according to claim 18 wherein the step of transforming is performed for correcting for both rotational and translational motion.

21. A method for motion correcting MRI measurement data as defined in claim 20 comprising the step of processing the at least a transformed image portion to coincide with a grid location of the at least an image.

22. A method for motion correcting MRI measurement data as defined in claim 1 comprising the step of reconstructing at least an image by inverse Fourier transforming the at least a k-space matrix.

23. A method for motion correcting MRI measurement data as defined in claim 22 wherein the at least an image comprises a sequence of images.

24. A method for motion correcting MRI measurement data comprising the steps of:
  receiving a plurality of sets of the MRI measurement data indicative of an image of an object, each set corresponding to one row $k_x$ of a k-space matrix;
  receiving cardiac and respiratory signal data, the cardiac and respiratory signal data being acquired simultaneously with the MRI measurement data from the object;
  selecting phases of cardiac and respiratory cycles and determining respective ranges based on the cardiac and respiratory signal data;
  selecting sets of the plurality of sets of the MRI measurement data being acquired during the selected phases of cardiac and respiratory cycles and falling within the determined ranges;
  determining for each selected set of the plurality of sets of the MRI measurement data a location within a k-space matrix corresponding to a row of the k-space matrix allocated thereto;
  generating the k-space matrix based on the allocated sets; and,
  reconstructing an image by inverse Fourier transforming the k-space matrix.

25. A method for motion correcting MRI measurement data as defined in claim 24 comprising the step of selecting a different phase of the cardiac and/or respiratory cycles if the k-space matrix is not filled completely.

26. A method for motion correcting MRI measurement data as defined in claim 24 comprising the step of increasing the ranges of the selected phases if the k-space matrix is not filled completely.

27. A method for motion correcting MRI measurement data as defined in claim 24 comprising the step of filling missing elements of the k-space matrix by interpolating between measurements of adjacent elements.

28. A method for motion correcting MRI measurement data as defined in claim 24 wherein the range of the selected phase of the cardiac cycle is determined along time axis.

29. A method for motion correcting MRI measurement data as defined in claim 27 wherein the range of the selected phase of the respiratory cycle is determined along chest volume axis.

30. A method for motion correcting MRI measurement data as defined in claim 24 wherein the exhale phase of the respiratory cycle is selected.

31. A method for motion correcting MRI measurement data as defined in claim 24 wherein the diastole phase of the cardiac cycle is selected.

32. A method for motion correcting MRI measurement data as defined in claim 30 wherein the diastole phase of the cardiac cycle is selected.

33. A system for motion correcting MRI measurement data comprising a storage medium having stored therein executable commands for execution on a processor, the processor when executing the commands performing the steps of:
  receiving a plurality of sets of the MRI measurement data indicative of at least an image of an object, each set corresponding to one row $k_x$ of a k-space matrix of at least a k-space matrix;
  receiving motion data indicative of a motion signal acquired from the object simultaneously with the plurality of sets of MRI measurements;
  selecting each set of the plurality of sets of the MRI measurements a k-space matrix of the at least a k-space matrix for allocation thereto;
  determining for each set of the plurality of sets of the MRI measurement data a location within the k-space matrix allocated thereto; and,
  generating at least a k-space matrix based on the sets of the plurality of sets of the MRI measurement data allocated thereto.

34. A system for motion correcting MRI measurement data as defined in claim 33 wherein the storage medium comprises executable commands for execution on a processor, the processor when executing the commands performing the step of determining the k-space matrix of the at least a k-space matrix for selection based on the motion data.

35. A system for motion correcting MRI measurement data as defined in claim 34 comprising:
  a first port for receiving the plurality of sets of the MRI measurement data;
  a second port for receiving the motion data; and,
  a processor in data communication with the first port, the second port and the storage medium, the processor for executing the executable commands for processing the plurality of sets of the MRI measurement data.

36. A system for motion correcting MRI measurement data as defined in claim 35 wherein the storage medium comprises executable commands for execution on the processor, the processor when executing the commands performing the step of: reconstructing at least an image by inverse Fourier transforming the at least a k-space matrix.

37. A system for motion correcting MRI measurement data as defined in claim 36 comprising a display in data communication with the processor for displaying the at least an image.

38. A system for motion correcting MRI measurement data as defined in claim 37 comprising a MRI system for acquiring the plurality of sets of MRI measurements from the object and for providing measurement data indicative thereof, the MRI system for being in data communication with the first port.

39. A system for motion correcting MRI measurement data as defined in claim 38 comprising a motion sensing system for acquiring a motion signal from the object and for providing motion data indicative thereof, the motion sensing system for being in data communication with the second port.

40. A system for motion correcting MRI measurement data as defined in claim 39 comprising:
  a first sensor for sensing cardiac motion of the object; and,
  a second sensor for sensing respiratory motion of the object.

41. A system for motion correcting MRI measurement data as defined in claim 39 wherein the motion sensing system comprises a sensor for acquiring a motion signal indicative of translational and rotational motion of the object.

* * * * *